(12) United States Patent
Finn

(10) Patent No.: US 8,322,624 B2
(45) Date of Patent: Dec. 4, 2012

(54) SMART CARD WITH SWITCHABLE MATCHING ANTENNA

(75) Inventor: David Finn, Tourmakeady (IE)

(73) Assignee: Feinics Amatech Teoranta, Lower Churchfield, Tourmakeady, Co Mayo (IE)

( * ) Notice: Subject to any disclaimer, the term of this patent is extended or adjusted under 35 U.S.C. 154(b) by 0 days.

(21) Appl. No.: 12/198,103

(22) Filed: Aug. 25, 2008

(65) Prior Publication Data

US 2008/0308641 A1    Dec. 18, 2008

Related U.S. Application Data

(63) Continuation-in-part of application No. 11/779,299, filed on Jul. 18, 2007, now Pat. No. 7,748,636, and a continuation-in-part of application No. 12/045,043, filed on Mar. 10, 2008.

(60) Provisional application No. 60/968,901, filed on Aug. 30, 2007.

(51) Int. Cl.
*G06K 19/06* (2006.01)

(52) U.S. Cl. ...................................................... 235/492

(58) Field of Classification Search .................. 235/492; 340/10.1, 10.2
See application file for complete search history.

(56) References Cited

U.S. PATENT DOCUMENTS

| | | |
|---|---|---|
| 3,674,914 A | 7/1972 | Burr |
| 4,014,602 A | 3/1977 | Ruell |
| 4,437,603 A | 3/1984 | Kobayashi et al. |
| 4,533,787 A | 8/1985 | Anderegg et al. |
| 4,641,773 A | 2/1987 | Morino et al. |
| 4,693,778 A | 9/1987 | Swiggett et al. |
| 4,730,188 A | 3/1988 | Milheiser |
| 4,884,334 A | 12/1989 | Houser et al. |
| 4,897,644 A | 1/1990 | Hirano |
| 4,912,143 A | 3/1990 | Ahn et al. |
| 5,034,648 A | 7/1991 | Gastgeb |
| 5,041,826 A | 8/1991 | Milheiser |
| 5,083,087 A | 1/1992 | Fox et al. |
| 5,084,699 A | 1/1992 | DeMichele |
| 5,094,907 A | 3/1992 | Yamura et al. |
| 5,166,676 A | 11/1992 | Milheiser |
| 5,201,453 A | 4/1993 | Amador et al. |
| 5,211,129 A | 5/1993 | Taylor et al. |
| 5,281,855 A | 1/1994 | Hadden et al. |
| 5,340,946 A | 8/1994 | Friedrich et al. |

(Continued)

FOREIGN PATENT DOCUMENTS

CA    2279176    7/1998

(Continued)

*Primary Examiner* — Daniel Hess
(74) *Attorney, Agent, or Firm* — Gerald E. Linden

(57) ABSTRACT

A smart card having a multi-layer substrate; a transponder module disposed in a first layer of the multi-layer substrate; a first antenna disposed in the first layer of the multi-layer substrate; and a second antenna disposed in a second layer of the multi-layer substrate. A switch and a capacitor in series with the second antenna. The first antenna may be tuned to a different frequency than the second antenna. An RFID chip and antenna in a mold mass disposed in a recess in the first layer of a substrate, behind a hologram disposed on the first layer of the substrate. The switch for the second antenna disposed under the RFID chip. A layer of ferrite material disposed between the hologram and the RFID chip. LEDs disposed behind the hologram.

16 Claims, 7 Drawing Sheets

U.S. PATENT DOCUMENTS

| | | | |
|---|---|---|---|
| 5,365,657 A | 11/1994 | Brown et al. | |
| 5,376,778 A | 12/1994 | Kreft | |
| 5,399,847 A | 3/1995 | Droz | |
| 5,491,302 A | 2/1996 | Distefano et al. | |
| 5,696,363 A | 12/1997 | Larchevesque | |
| 5,741,392 A | 4/1998 | Droz | |
| 5,773,812 A | 6/1998 | Kreft | |
| 5,809,633 A | 9/1998 | Mundigl et al. | |
| 5,988,510 A * | 11/1999 | Tuttle et al. | 235/492 |
| 6,008,993 A | 12/1999 | Kreft | |
| 6,072,383 A * | 6/2000 | Gallagher et al. | 340/10.2 |
| 6,088,230 A | 7/2000 | Finn et al. | |
| 6,095,423 A | 8/2000 | Houdeau et al. | |
| 6,095,915 A | 8/2000 | Geissler | |
| 6,107,920 A | 8/2000 | Eberhardt et al. | |
| 6,111,288 A | 8/2000 | Watanabe et al. | |
| 6,142,381 A | 11/2000 | Finn et al. | |
| 6,190,942 B1 | 2/2001 | Wilm et al. | |
| 6,206,292 B1 | 3/2001 | Robertz et al. | |
| 6,233,818 B1 | 5/2001 | Finn et al. | |
| 6,259,369 B1 | 7/2001 | Monico | |
| 6,288,443 B1 | 9/2001 | Finn et al. | |
| 6,310,778 B1 | 10/2001 | Finn et al. | |
| 6,343,744 B1 * | 2/2002 | Shibata et al. | 235/492 |
| 6,375,083 B2 * | 4/2002 | Fries et al. | 235/492 |
| 6,424,029 B1 | 7/2002 | Giesler | |
| 6,471,878 B1 | 10/2002 | Greene et al. | |
| 6,521,829 B2 | 2/2003 | Matsumura et al. | |
| 6,522,308 B1 | 2/2003 | Mathieu | |
| 6,575,374 B1 | 6/2003 | Boyadjian et al. | |
| 6,600,219 B2 * | 7/2003 | Higuchi | 257/679 |
| 6,606,247 B2 | 8/2003 | Credelle et al. | |
| 6,626,364 B2 | 9/2003 | Taban | |
| 6,628,240 B2 | 9/2003 | Amadeo | |
| 6,634,564 B2 * | 10/2003 | Kuramochi | 235/492 |
| 6,667,092 B1 | 12/2003 | Brollier et al. | |
| 6,677,917 B2 | 1/2004 | Van Heerden et al. | |
| 6,693,513 B2 * | 2/2004 | Tuttle | 340/10.1 |
| 6,698,089 B2 | 3/2004 | Finn et al. | |
| 6,870,497 B2 | 3/2005 | Kondo et al. | |
| 6,879,424 B2 | 4/2005 | Vincent et al. | |
| 6,902,116 B2 * | 6/2005 | Finkelstein | 235/492 |
| 7,011,980 B1 | 3/2006 | Na et al. | |
| 7,054,050 B2 | 5/2006 | Vincent et al. | |
| 7,093,499 B2 | 8/2006 | Baudendistel | |
| 7,145,432 B2 | 12/2006 | Lussey et al. | |
| 2001/0044013 A1 * | 11/2001 | McDonough et al. | 428/202 |
| 2002/0020903 A1 | 2/2002 | Kreft et al. | |
| 2003/0132301 A1 | 7/2003 | Selker | |
| 2004/0089707 A1 | 5/2004 | Cortina et al. | |
| 2004/0155114 A1 | 8/2004 | Rietzler | |
| 2005/0206524 A1 | 9/2005 | Forster et al. | |
| 2005/0237198 A1 * | 10/2005 | Waldner et al. | 340/572.7 |
| 2005/0282355 A1 | 12/2005 | Edwards et al. | |
| 2005/0282495 A1 | 12/2005 | Forster | |
| 2006/0114109 A1 | 6/2006 | Geissler | |
| 2006/0255903 A1 | 11/2006 | Lussey et al. | |
| 2007/0290051 A1 | 12/2007 | Bielmann et al. | |

FOREIGN PATENT DOCUMENTS

| | | |
|---|---|---|
| CA | 2555034 | 9/2005 |
| DE | 28 11 458 | 2/1979 |
| DE | 36 22 246 | 1/1987 |
| DE | 42 05 084 | 9/1993 |
| DE | 195 25 933 | 1/1997 |
| DE | 195 41 039 | 5/1997 |
| DE | 19542900 | 5/1997 |
| DE | 196 10 507 | 9/1997 |
| DE | 196 16 424 | 10/1997 |
| DE | 196 54 902 | 10/1997 |
| DE | 196 34 473 | 1/1998 |
| DE | 196 46 717 | 5/1998 |
| DE | 196 51 566 | 6/1998 |
| DE | 197 16 912 | 11/1998 |
| DE | 19742126 | 3/1999 |
| DE | 197 41 984 | 6/1999 |
| DE | 198 50 353 | 3/2000 |
| DE | 199 20 593 | 11/2000 |
| DE | 10140662 | 3/2003 |
| DE | 10 2004 043 747 | 3/2006 |
| DE | 20 2005 016 382 | 3/2006 |
| FR | 2728710 | 6/1996 |
| GB | 1 593 235 | 7/1981 |
| JP | 6-351194 A | 12/1994 |
| WO | WO 91 16718 | 10/1991 |
| WO | WO 95 26538 | 10/1995 |
| WO | WO 97 30418 | 8/1997 |
| WO | WO 97 35273 | 9/1997 |
| WO | WO98/20450 | 5/1998 |
| WO | WO 00/21030 | 4/2000 |
| WO | WO 00/36891 | 6/2000 |
| WO | WO 00 68994 | 11/2000 |
| WO | WO 2006 050691 | 5/2006 |

* cited by examiner

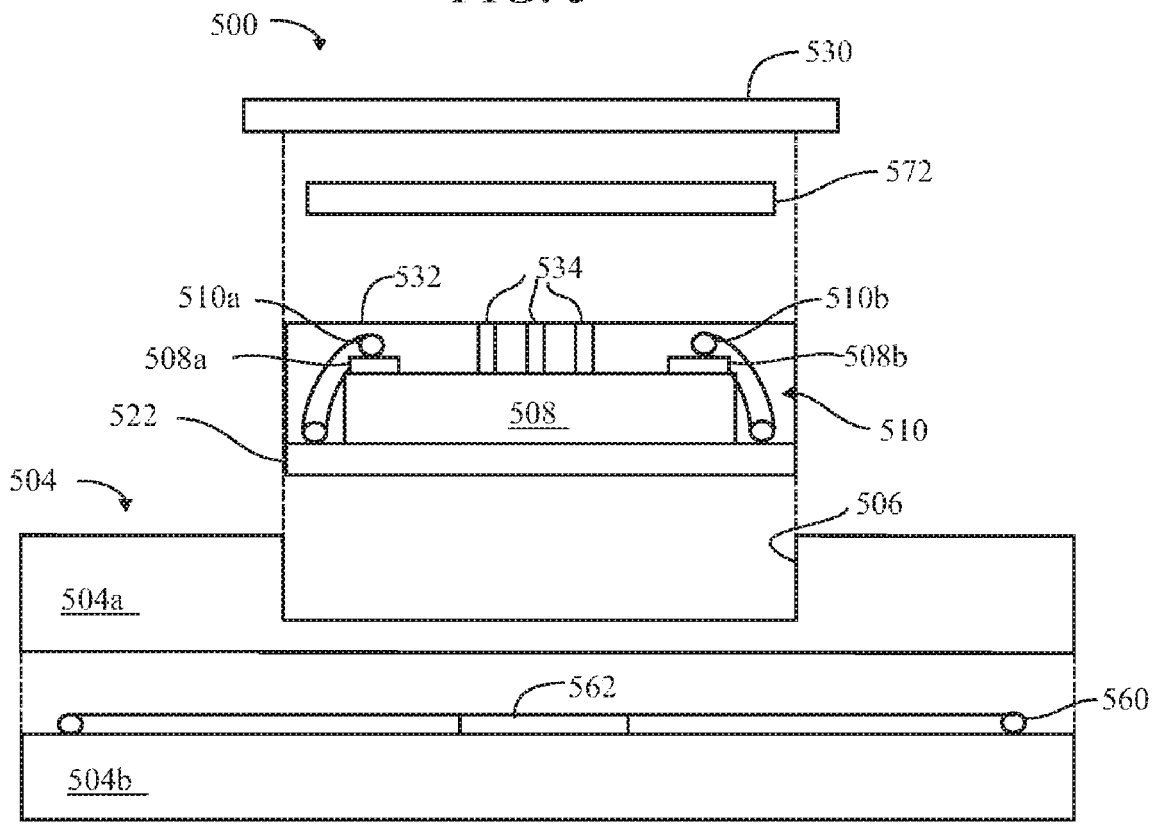

SMART CARD WITH SWITCHABLE MATCHING ANTENNA

TECHNICAL FIELD OF THE INVENTION

The invention relates to smart cards, more particularly to smart cards incorporating a contactless interface, such as ISO 14443.

BACKGROUND OF THE INVENTION

A smart card resembles a credit card in size and shape. (See ISO 7810). The inside of a smart card usually contains an embedded 8-bit microprocessor. The microprocessor is under a gold contact pad on one side of the card. Smarts cards may typically have 1 kilobyte of RAM, 24 kilobytes of ROM, 16 kilobytes of programmable ROM, and an 8-bit microprocessor running at 5 MHz. The smart card uses a serial interface and receives its power from external sources like a card reader. The processor uses a limited instruction set for applications such as cryptography. The most common smart card applications are:
Credit cards
Electronic cash
Computer security systems
Wireless communication
Loyalty systems (like frequent flyer points)
Banking
Satellite TV
Government identification Smart cards can be used with a smart-card reader attachment to a personal computer to authenticate a user. (However, these readers are relatively costly, and have not been well accepted by users.) Web browsers also can use smart card technology to supplement Secure Sockets Layer (SSL) for improved security of Internet transactions. The American Express Online Wallet shows how online purchases work using a smart card and a PC equipped with a smart-card reader. Smart-card readers can also be found in vending machines.

There are three basic types of smart cards: contact chip, contactless and dual interface (DI) cards.

A contact smart card (or contact chip card) is a plastic card about the size of a credit card that has an embedded integrated circuit (IC) chip to store data. This data is associated with either value or information or both and is stored and processed within the card's chip, either a memory or microprocessor device.

The predominant contact smart cards in consumer use are telephone cards as a stored value tool for pay phones and bank cards for electronic cash payments. Contact smart cards require the placement of the card in a terminal or automatic teller machine for authentication and data transaction. By inserting the contact smart card into the terminal, mechanical and electrical contact is made with the embedded chip module.

Contactless smart cards have an embedded antenna connected to a microchip, enabling the card to pick up and respond to radio waves. The energy required for the smart card to manipulate and transmit data is derived from the electromagnetic field generated by a reader. Contactless smart cards do not require direct contact with the reader because they employ the passive transponder technology of Radio Frequency Identification (RFID). By just waving the card near the reader, secure identification, electronic payment transaction and authentication are completed in milliseconds.

Contactless chip card technology is based on two standards: ISO/IEC 14443 Type A and Type B (for proximity cards), and ISO/IEC 15693 (for vicinity cards). Cards that comply with these standards operate at the 13.56 MHz frequency. ISO/IEC 14443 products have a range of up to 10 cm (centimeters), while ISO/IEC 15693 products can operate at a range between 50 and 70 cm.

Dual interface (DI) cards, sometimes called combination chip cards, are microprocessor multi-function cards that incorporate both the functions of a contact chip card and a contactless card. Within the smart card is a microprocessor or micro-controller chip with radio frequency identification (RFID) capability that manages the memory allocation and file access. The on-board memory is shared and can be accessed either in contact or contactless mode.

This type of chip is similar to those found inside all personal computers and when implanted in a smart card, manages data in organized file structures, via a card operating system. This capability permits different and multiple functions and/or different applications to reside on the card.

A dual interface (DI) card is ideal for single and multi-application markets ranging from micro-payment (convenient alternative to low value cash transaction) to e-commerce and from ticketing in mass transit to secure identification for cross border control. Originally, such cards were intended to be used in conjunction with a reader connected to a PC for downloading tickets, tokens, or electronic money via the contact interface and used in contactless mode in the application for physical access or proximity payment Passive radio frequency identification (RFID) devices derive their energy from the electromagnetic field radiated from the reader. Because of international power transmission restrictions at the frequencies of 125 KHz and 13.56 MHz, the contactless integrated circuits are generally low voltage and low power devices. Read/Write circuits use low voltage EEPROM and low power analogue cells. The read/write memory capacity in transponders, contact smart cards, contactless memory based smart cards, dual interface smart cards (contact & contactless) and multi-interface micro-controllers is generally limited to approximately 64 kilobytes.

Contactless Interfaces

As used herein, "contactless interfaces" refers to high radio frequency (RF) connections between one device and another, typically over a very short distance, such as only up to 50 cm. The following are examples of contactless interfaces and/or devices that typically connect via a contactless interface.

ISO 14443 ISO 14443 RFID cards; contactless proximity cards operating at 13.56 MHz with a read/write range of up to 10 cm. ISO 14443 defines the contactless interface smart card technical specification.

ISO 15693 ISO standard for contactless integrated circuits, such as used in RF-ID tags. ISO 15693 RFID cards; contactless vicinity cards operating at 13.56 MHz with a read/write range of up to 100 cm. (ISO 15693 is typically not used for financial transactions because of its relatively long range as compared with ISO 14443.)

NFC Short for "Near Field Communication". NFC is a contactless connectivity technology that enables short-range communication between electronic devices. If two devices are held close together (for example, a mobile phone and a personal digital assistant), NFC interfaces establish a peer-to-peer protocol, and information such as phone book details can be passed freely between them. NFC devices can be linked to contactless smart cards, and can operate like a contactless smart card, even when powered down. This means that a mobile phone can operate like a transportation card, and enable fare payment and access to the subway. NFC is an open platform technology standardized in ECMA (European Computer Manufacturers Association) 340 as well as ETSI (European Telecommunications Standards Institute) TS 102 190 V1.1.1 and ISO/IEC 18092. These standards specify the modulation schemes, coding, transfer speeds, and frame format of the RF interface of NFC devices, as well as initialization schemes and conditions required for data collision-control during initialization—for both passive and active modes.

RFID Short for "Radio Frequency Identification". An RFID device interacts, typically at a limited distance, with a "reader", and may be either "passive" (powered by the reader) or "active" (having its own power source, such as a battery).

Wireless Versus Contactless Interfaces

Wireless and Contactless are two types of radio frequency (RF) interfaces. In a most general sense, both are "wireless" in that they do not require wires, and that they use RF. However, in the art to which this invention most nearly pertains, the terms "wireless" and "contactless" have two very different meanings and two very different functionalities.

Wireless interfaces are exemplified by WLAN, Zigbee, Bluetooth and UWB. These wireless interfaces operate at a distance of several meters, generally for avoiding "cable spaghetti" for example, Bluetooth for headsets and other computer peripherals. WLAN is typically used for networking several computers in an office.

The contactless interfaces of interest in the present invention are principally RFID contactless interfaces such as ISO 14443, 15693 and NFC. RFID operates at a maximum distance of 100 cm for the purpose of identification in applications such as access control. In a payment (financial transaction) application, the distance is restricted to 10 cm. For example, a contactless RFID smart card protocol according to ISO 14443 can be used for private, secure financial transactions in "real world" applications such as payment at a retailer.

Wireless and contactless use different communications protocols with different capabilities and are typically used for very different purposes. Note, for example, that 100 cm (ISO 15693, an RFID contactless protocol) is considered to be too great a distance to provide appropriate security for (contactless) financial transactions. But 100 cm would not be enough to provide a (wireless) network between office computers! Additionally, generally, contactless technology is primarily passive (having no power source of its own), deriving power to operate from the electromagnetic field generated by a nearby reader. Also, contactless technology, using the smart card protocol, is used for secure identification, authentication and payment. Wireless technologies, on the other hand, generally require their own power source (either batteries, or plugged in) to operate. Contactless is different than wireless; different protocol, different signal characteristics, different utility, different energy requirements, different capabilities, different purposes, different advantages, different limitations.

Secure Inlays

As used herein, an "inlay", particularly a "secure inlay" comprises an inlay site containing a high frequency RFID chip and an antenna embedded into a multi-layer substrate and connected to the terminals (terminal areas) of the RFID chip.

Typically, in the manufacture of a secure inlay, the RFID chip is positioned in a recess in a layer of the substrate, supported by a lower substrate layer, then a wire conductor is embedded or countersunk onto or into the top substrate layer in the direction of the RFID chip. Then, the wire conductor is guided over a first terminal area of the RFID chip, then the embedding process is continued by forming an antenna in the top substrate layer with a given number of turns. Then the wire is guided over the second terminal area. And, finally, the wire conductor is again embedded into the top substrate layer before cutting the wire to complete the high frequency transponder site.

In a next stage of the production process, the wire ends passing over the terminal areas are interconnected by means of thermal compression bonding. Adhesively placing a wire conductor onto the top substrate layer is an alternative to embedding, and typically involves self-bonding coated wire conductor.

A wire embedding apparatus may be an ultrasonic wire guide tool, known as a "sonotrode", with a wire feed channel (capillary) passing through the center of the wire guide tool. The wire conductor is fed through the wire guide tool, emerges from the tip, and by application of pressure and ultrasonic energy the wire conductor is "rubbed" into the substrate, resulting in localized heating of the wire conductor and subsequent sinking of the wire conductor into the substrate material during the movement of the wire guide tool. A wire placement apparatus may also be an ultrasonic tool similar in function to an ultrasonic horn which heats the wire to form an adhesion with a substrate.

U.S. Pat. No. 6,698,089 ("089 patent"), incorporated by reference in its entirety herein, discloses device for bonding a wire conductor. Device for the contacting of a wire conductor in the course of the manufacture of a transponder unit arranged on a substrate and comprising a wire coil and a chip unit, wherein in a first phase the wire conductor is guided away via the terminal area or a region accepting the terminal area and is fixed on the substrate relative to the terminal area or the region assigned to the terminal area by a wire guide and a portal, and in a second phase the connection of the wire conductor to the terminal area is effected by means of a connecting instrument. FIGS. 1 and 2 of the 089 patent show a wire conductor 20 being embedded in a surface of a substrate 21, by the action of ultrasound. FIG. 3 of the 089 patent shows a wiring device 22 with an ultrasonic generator 34, suitable for embedding the wire. It is believed that the wiring device in the 089 patent can also be used for adhesively placing a wire.

U.S. Pat. No. 5,281,855, incorporated by reference in its entirety herein, discloses a method and apparatus for facilitating interconnection of lead wires to an integrated circuit including the provision of an additional protective layer of insulation to the top of an integrated circuit chip or die and the provision of enlarged plated electrodes to the surface of the additional insulation to form enhanced bonding pads, such pads being electrically connected through the protective layers to the normal bonding pads of the integrated circuit device. The enhanced bonding pads are made of a soft conductive metal such that external wires to be attached thereto can be bonded to the pads using a thermal compression bonding technique.

U.S. Pat. No. 6,088,230, incorporated by reference in its entirety herein, discloses a procedure for producing a transponder unit (55) provided with at least one chip (16) and one coil (18), and in particular a chip card/chip-mounting board (17) wherein the chip and the coil are mounted on one common substrate (15) and the coil is formed by installing a coil wire (21) and connecting the coil-wire ends (19, 23) to the contact surfaces (20, 24) of the chip on the substrate.

Canada Patent Application CA 2555034, incorporated by reference in its entirety herein, discloses a method for the production of a book-type security document with at least one security cambric (15) and at least one transponder unit (21), characterized in that: at least one laminated layer (22, 23) is applied at least on one side of the at least one security cambric (4 5) and on at least one side of the at least one transponder unit (21); the at least one security cambric (15) and the at least one transponder unit (21) are fully encompassed by the laminated layers (22, 23) and that a circumferential, closed edge (24) is provided by the laminated layers (22, 231, and that a laminated layer sheath (25) is formed.

U.S. Pat. No. 7,229,022, incorporated by reference in its entirety herein, discloses method for producing a contactless chip card and chip card. A method for producing a transponder, especially a contactless chip card (1) comprises at least one electronic component (chip module 2) and at least one antenna (3); the at least one electronic chip component (2) being disposed on a non-conducting substrate that serves as a support for the component. The at least one antenna is also disposed on a non-conducting substrate, the at least one electronic component (2) being applied to a first substrate and the antenna (3) on a second substrate. The entire circuit (1) is then produced by joining the individual substrates so that they are correctly positioned relative to each other. The components (2, 3) are contacted once the different substrates have been joined by means of auxiliary materials such as solder or glue, or without auxiliary materials by microwelding. The non-conducting substrates form a base card body.

PCT/US99/28795 (WO 00/36891), incorporated by reference in its entirety herein, discloses methods for wire-scribing filament circuit patterns with planar and non-planar portions. An apparatus and method of forming filament circuit patterns with planar and non-planar portions and interconnection cards, smart cards or optical fiber circuit cards formed therefrom are provided. A filament circuit path is scribed by moving a filament guide and a substrate relative to one another, and dispensing a filament on, or in the vicinity of, a surface of the substrate. The filament or the substrate or both have adhesive surface(s). The adhesive surface is capable of being adhesively actuated by application of energy. Energy is applied simultaneous with, or subsequent to, scribing. A portion of the filament circuit pattern is planar and another portion is non-planar. The non-planar portion traverses but does not contact or adhere to a pre-selected area of the substrate. The pre-selected area corresponds with a pad, a contact pattern, a hole, a slot, a raised feature, a part of the previously scribed planar portion of the pattern, and a filament termination point. Alternately, the non-planar portion may be embedded below the surface of the substrate. Another planar portion of the filament circuit traverses the non-planar portion but does not contact or adhere to a pre-selected part of the previously scribed non-planar portion. According to the above method wire-scribed circuit boards are formed including interconnection cards, smart cards or optical fiber circuit cards.

An Inlay and Transponder of the Prior Art

FIGS. 1A and 1B illustrate an inlay substrate (or sheet) 100 having a plurality of transponder areas. A selected one of the transponder areas 102 constituting a single transponder is shown in detail. The vertical and horizontal dashed lines (in FIG. 1A) are intended to indicate that there may be additional transponder areas (and corresponding additional transponders) disposed to the left and right of, as well as above and below, the transponder area 102, on the inlay sheet 100. Such a plurality of transponders may be arranged in an array on the (larger) inlay sheet. As best viewed in FIG. 1B, the inlay sheet 100 may be a multi-layer substrate 104 comprising one or more upper (top) layers 104a and one or more lower (bottom) layers 104b. (Each layer may be considered to be a substrate.)

A recess 106 may be formed in (through) the upper layer 104a, at a "transponder chip site", so that a transponder chip 108 may be disposed in the recess, and supported by the lower layer 104b. The transponder chip 108 is shown having two terminals 108a and 108b on a top surface thereof. The transponder chip 108 may be a chip module, or an RFID chip.

Generally, the recess 106 is sized and shaped to accurately position the transponder chip 108, having side dimensions only slightly larger than the transponder chip 108 to allow the transponder chip 108 to be located within the recess. For example, 1. the transponder chip 108 may measure: 5.0×8.0 mm
2. the recess 106 may measure: 5.1×8.1 mm
3. the terminals 108a/b may measure: 5.0×1.45 mm
4. the wire (discussed below) may have a diameter between 60 and 112 µm One millimeter (mm) equals one thousand (1000) micrometers (µm, "micron").

In FIGS. 1A and 1B, the recess 106 may be illustrated with an exaggerated gap between its inside edges and the outside edges of the chip 108, for illustrative clarity. In reality, the gap may be only approximately 50 µm-100 µm (0.05 mm-0.1 mm).

In FIG. 1A the terminals 108a and 108b are shown reduced in size (narrower in width), for illustrative clarity. (From the dimensions given above, it is apparent that the terminals 108a and 108b can extend substantially the full width of the transponder chip 108.)

It should be understood that the transponder chip 108 is generally snugly received within the recess 106, with dimensions suitable that the chip 108 does not move around after being located within the recess 106, in anticipation of the wire ends 110a, 110b being bonded to the terminals 108a, 108b. As noted from the exemplary dimensions set forth above, only very minor movement of the chip 108, such as a small fraction of a millimeter (such as 50 µm-100 µm) can be tolerated.

As best viewed in FIG. 1A, an antenna wire 110 is disposed on a top surface (side) of the substrate, and may be formed into a flat (generally planar) coil, having two end portions 110a and 110b.

The substrate 100 may be in the form of a credit card, having a width (horizontal, as illustrated) of approximately 48 mm, and a length (vertical, as illustrated in FIG. 1A) of approximately 80 mm.

The antenna 110 may be formed by 4 or 5 turns of wire, such as coated wire, having a diameter of 0.08 mm (80 µm), and located just inside of (for example, 3-5 mm in from the edge of) the periphery of the substrate. Hence, each turn of wire may extend approximately 45 mm×75 mm×45 mm×75 mm (minus the dimension of the chip 108), or about 240 mm, so 4 turns would have a total length of approximately 1 meter. The pitch, or spacing between turns of wire may be about 0.46 mm. The resonant frequency of the antenna, connected with the chip, may be 13.56 MHz, conforming to ISO 14443.

As best viewed in FIG. 1B, the antenna wire is "mounted" to the substrate, which includes "embedding" (countersinking) the antenna wire into the surface of the substrate, or "adhesively placing" (adhesively sticking) the antenna wire on the surface of the substrate. In either case (embedding or adhesively placing), the wire typically feeds out of a capillary 116 of an ultrasonic wire guide tool (not shown). The capillary 116 is typically disposed perpendicular to the surface of the substrate 100. The capillary 116 is omitted from the view in FIG. 1A, for illustrative clarity.

The antenna wire 110 may be considered "heavy" wire (such as 60 µm-112 µm), which requires higher bonding loads than those used for "fine" wire (such as 30 μm). Rectangular section copper ribbon (such as 60×30 μm) can be used in place of round wire.

The capillary 116 may be vibrated by an ultrasonic vibration mechanism (not shown), so that it vibrates in the vertical or longitudinal (z) direction, such as for embedding the wire in the surface of the substrate, or in a horizontal or transverse (y) direction, such as for adhesively placing the wire on the surface of the substrate. In FIG. 1B, the wire 110 is shown slightly spaced (in drawing terminology, "exploded" away) from the substrate, rather than having been embedded (countersunk) in or adhesively placed (stuck to) on the surface of the substrate.

The antenna wire 110 may be mounted in the form of a flat coil, having two ends portions 110a and 110b. The ends portions 110a and 110b of the antenna coil wire 110 are shown extending over (FIG. 1A) and may subsequently be connected, such as by thermal-compression bonding (not shown), to the terminals 108a and 108b of the transponder chip 108, respectively.

Examples of embedding a wire in a substrate, in the form of a flat coil, and a tool for performing the embedding (and a discussion of bonding), may be found in the aforementioned U.S. Pat. No. 6,698,089 (refer, for example, to FIGS. 1, 2, 4, 5, 12 and 13 of the patent). It is known that a coated, self-bonding wire will stick to a synthetic (e.g., plastic) substrate because when vibrated sufficiently to soften (make sticky) the coating and the substrate.

In FIG. 1B, the wire 110 is shown slightly spaced (in drawing terminology, "exploded" away) from the terminals 108a/b of the transponder chip 108, rather than having been bonded thereto, for illustrative clarity. In practice, this is generally the situation—namely, the end portions of the wires span (or bridge), the recess slightly above the terminals to which they will be bonded, in a subsequent step. Also illustrated in FIG. 1B is a "generic" bond head, poised to move down (see arrow) onto the wire 110b to bond it to the terminal 108b. The bond head 118 is omitted from the view in FIG. 1A, for illustrative clarity.

The interconnection process can be inner lead bonding (diamond tool), thermal compression bonding (thermode), ultrasonic bonding, laser bonding, soldering, ColdHeat soldering (Athalite) or conductive gluing.

As best viewed in FIG. 1A, in case the antenna wire 110 needs to cross over itself, such as is illustrated in the dashed-line circled area "c" of the antenna coil, it is evident that the wire should typically be an insulated wire, generally comprising a metallic core and an insulation (typically a polymer) coating. Generally, it is the polymer coating that facilitates the wire to be "adhesively placed" on (stuck to) a plastic substrate layer. (It is not always the case that the wire needs to cross over itself. See, for example, FIG. 4 of U.S. Pat. No. 6,698, 089).

In order to feed the wire conductor back and forth through the ultrasonic wire guide tool, a wire tension/push mechanism (not shown) can be used or by application of compressed air it is possible to regulate the forward and backward movement of the wire conductor by switching the air flow on and off which produces a condition similar to the Venturi effect.

By way of example, the wire conductor can be self-bonding copper wire or partially coated self bonding copper wire, enamel copper wire or partially coated enamel wire, silver coated copper wire, un-insulated wire, aluminum wire, doped copper wire or litz wire.

FIG. 1A herein resembles FIG. 5 of U.S. Pat. No. 6,698, 089 (the '089 patent), which has a similar coil antenna (50) with an initial coil region (51) and a final coil region (52) comparable to the antenna 110 with two end portions 110a and 110b described herein. In the '089 patent, the coil (50) is arranged on a substrate 55 which comprises a substrate recess (56, compare 106 herein) in the interior region (53) of the coil (50).

In FIG. 5 of the '089 patent, it can be seen that the initial and final coil regions (end portions) of the wires extend across the recess. In FIG. 6 of the '089 patent, it can be seen that the recess extends completely through the substrate. If the antenna is mounted to the substrate prior to the chip being installed in the recess (and the antenna is mounted to the front/top surface/side of the substrate, as shown), due to the fact that the antenna wires are "blocking" entry to the recess from the top/front surface of the substrate, the chip must be installed into the recess from the back (bottom) side of the substrate, as indicated by FIG. 6 of the '089 patent.

FIG. 7 of the '089 patent shows the subsequent (inter) connection of the terminal areas 59 of the chip unit 58 to the initial coil region 51 and to the final coil region 52 by means of a thermode 60 which under the influence of pressure and temperature creates a connection by material closure between the wire conductor 20 and the terminal areas 59, as an overall result of which a card module 64 is formed.

Contactless Cards with Switches

US Patent Publication No. 2007/0290051, incorporated by reference in its entirety herein, discloses contactless card with membrane switch made of elasto-resistive material. The card (1), such as a credit card or other similar card, comprises at least a RFID chip module (3) and an antenna (4). The antenna (4) is interrupted in an interruption zone with two separated contact ends (5',5") and a contacting material (10) is placed in said interruption zone in order to enable a contact between said two separated ends (5',5"). Said contacting material (10) becomes conductive under pressure so that the antenna is functional only when the contacting material (10) is put under pressure by a user. As disclosed therein:

A switch is mounted on contactless cards, in particular credit cards, for improving security of said card and reducing the risk of forgery.

Contactless cards with a switch are known in the art. Such chip cards usually incorporates one or several switches which can be manually operated and allow the electronics or parts of the electronics of the card to be manually switched on or off so as to release data and characteristics of the chip card only in accordance with the choice of the user of the chip card. This renders the unauthorized identification of the chip card more difficult. The activation of such a card by switches in the plastic card is also possible in emergency situations.

A typical example is disclosed in DE 197 42 126 which relates to a portable data medium with an activation switch. In this prior art, a switching device operated by the user is connected between the antenna and the chip so that reception of data is only possible after activation of the switching device. Further examples are given by DE 19542 900, U.S. Pat. No. 5,376,778 and U.S. Pat. No. 4,897,644.

PCT publication WO 98/20450 discloses an identification card with a transaction coil and a method for manufacturing such card. The transaction coil is formed from a silver or generally conductive paste silk screen component which is incorporated in a plastic card body corresponding to the conventional ISO standards and whose ends are subsequently bared by means of a milling process for implanting a special chip module, or whose contact ends have already been kept free in a lamination or injection-molding process, and whose contacting can only be realized by intentionally exerting pressure and becomes automatically inactive after ending this pressure. The deliberate switching of a transponder coil is essential in this case. However, this card is also very elaborate as regards its manufacture and, in operation, it is sensitive to disturbances.

More recently, for example in WO 05/062245, the idea is to provide an antenna switch which allows, in a switched on position, the electrical contacting of two antenna pads such that the contactless communication with a reader is enabled. In a switched-off position, the pads of the antenna are electrically disconnected and the contactless communication with the reader is disabled.

Other similar devices are known from US 2003/132301, DE 10140662, U.S. Pat. No. 5,696,363 and U.S. Pat. No. 6,343,744, all of which are, incorporated by reference in their entirety herein.

All the examples cited above propose a mechanical switch, however, rather complicated from a manufacturing point of view and, in operation, it is sensitive to disturbances.

Other examples of an electronic card with a function which can be manually activated but avoiding the use of a mechanical switch are known from U.S. Pat. No. 6,424,029 and FR 2 728 710, both of which are, incorporated by reference in their entirety herein.

In U.S. Pat. No. 6,424,029, incorporated by reference in its entirety herein, a chip card is described, preferably a contactless chip card, comprising a data-processing circuit for receiving, processing and/or transmitting data signals, and at least a capacitive switching element which can be activated by means of a user's touch. The activation of the switching element triggers at least the transmission of data signals from the data-processing circuit and without whose activation at least the transmission of data signals from the data-processing circuit is prevented.

In FR 2 728 710, incorporated by reference in its entirety herein, the electronic card has a plastic body comprising the function components that are fed from the battery. The battery is connected to a sensor whose physical properties vary due to its manual operation. An electronic circuit monitors the operation of the function components independently of the state of the sensor. A resistance strain gauge may be used as a sensor which reacts to bending of the card, or a thermistor may be used which responds to the warmth of a user's finger touching the card. The sensor may also comprise pairs of electrodes between which the resistance changes upon a user's touch. For a reliable operation, the components should only be activated when the rate of change of the physical property detected by the sensor is within a predetermined range.

These sensors have proved to be unreliable. For example, the responses of a thermistor or a thermoelement or the resistor between two electrodes may be dependent on the temperature of the user's finger or on the fact whether the user wears gloves.

Related Patent References

U.S. Pat. No. 5,084,699, incorporated by reference in its entirety herein, describes an impedance matching coil assembly for an inductively coupled transponder. A coil assembly for use in an inductively powered transponder including a primary coil and a secondary coil wrapped around the same coil forming ferrite rod. The primary coil's leads are left floating while the secondary coil's leads are connected to the integrated identification circuit of the transponder. There are approximately three times as many turns to the primary coil as there are turns to the secondary coil. The primary coil is configured to self resonate at the operating frequency of the identification circuit when brought within range of an interrogator's magnetic field, thereby creating a voltage across the primary coil having a high source impedance. The secondary coil is configured to resonate at the same operating frequency, but to convert the high source impedance level of the primary coil to a low source impedance level, which is more suitable for powering the identification circuit and which substantially matches the impedance level of the secondary coil to the impedance level of the interrogator field, thereby maximizing the quantity of energy which can be transferred between the interrogator and the transponder.

Canadian patent application CA 2,279,176, incorporated by reference in its entirety herein, describes a transmission module for a transponder device, transponder device and method for operating said device. The invention relates to a transmission module (14) for contactless transmission of data between a chip (15) and a reading device (12) with a coil arrangement comprising a coupling element (19 and at least one antenna coil (20) that are electrically interconnected, wherein said coupling element is used to produce inductive coupling with a transponder coil (18) which is electrically connected to the chip, and the antenna coil is used to enable connection to the reading device. The coupling element embodied as a coupling coil (19) and the antenna coil (20) are configured differently with respect to the coil parameters affecting coil impedance.

U.S. Pat. No. 6,111,288, incorporated by reference in its entirety herein, describes a new switching element and a circuit device and the like using the same element are provided, which comprises semiconductor in which a channel region is formed at an interface with an insulating film, first and second terminals S, D, which are located in corresponding manner to both ends of the channel region, and through which a tunnel current is let to flow into the channel region, and a third terminal G giving a high frequency vibration to a potential barrier of the channel region through the insulating film, wherein the tunnel current flowing into the channel region is increased as a value of an exponential function is increased with a predetermined threshold vibration frequency as a boundary value.

U.S. Pat. No. 6,522,308, incorporated by reference in its entirety herein, disclosed variable capacitance coupling antenna and concerns a coupling antenna connected to an electromagnetic wave transceiver device containing one or several integrated capacitors. This coupling antenna includes at least one screen printed turn (24) on a support (28) consisting of an insulating dielectric support and also includes a screen printed capacitor on the support, connected in parallel, thereby reducing the capacitance supplied by the capacitor(s) built into the device, so that the resulting capacitance forms a resonating circuit with the turn. The invention also concerns the fabrication process of such an antenna and the use of this antenna in a contactless or hybrid contact-contactless smart card.

U.S. Pat. No. 7,093,499, incorporated by reference in its entirety herein, describes a force sensor, or a method, determines a force using at least a measured inductance in a coil wherein a quantum tunneling composite is located in a magnetic path created by the coil, is positioned in a load path of the force, and is under strain from the force. A strain sensor, or a method, determines a strain using at least a measured inductance in a coil wherein a quantum tunneling composite is located in a magnetic path created by the coil, is positioned in a load path of a force, and is under strain from the force.

U.S. Pat. No. 7,145,432 and US Patent Application 20060255903, incorporated by reference in their entirety herein, describe a flexible switching device in which an electronic resistor user interface comprises flexible conductive materials and a flexible variably resistive element capable of exhibiting a change in electrical resistance on mechanical deformation and is characterized by textile-form electrodes (10, 12) a textile form variably resistive element (14) and textile-form members (16) connective to external circuitry.

U.S. Pat. No. 5,034,648, incorporated by reference in its entirety herein, describes a piezo film switch which comprises a cantilever with a pair of layers, including a piezo film layer and a flexible, backing layer laminated thereto. The piezo film layer produces a positive or negative output pulse, depending upon a direction of deflection of the cantilever. Interface circuitry coupled to the piezo film layer is powered by the output pulses and provides "pseudo contact closures" which emulate the operation of a mechanical switch.

U.S. Patent Application 2007/0290051 describes a contactless card with membrane switch made of elasto-resistive material whereby the card such as a credit card or other similar card, comprises at least a RFID chip module and an antenna. The antenna is interrupted in an interruption zone with two separated contact ends and a contacting material is placed in said interruption zone in order to enable a contact between said two separated ends. Said contacting material becomes conductive under pressure so that the antenna is functional only when the contacting material is put under pressure by a user.

Patent References Related To Displays

U.S. Pat. No. 6,879,424 describes an electrochromic display device and compositions useful in making such devices. It relates to a composition and to a display device having the composition positioned between electrodes. The composition contains: (a) a compound that undergoes a reversible redox reaction to generate a pH gradient between the two electrodes, (b) an indicator dye, (c) a charge transport material, and optionally, (d) a matrix material and (e) an opacifier, and (f) secondary redox couple wherein components (a), (b), and (c) are different from one another and the standard reduction potential of component (a) is less than the standard reduction potential for the other components. Depending on the electric field present between the electrodes, a display image may be generated.

U.S. Pat. No. 7,054,050, incorporated by reference in its entirety herein, describes an electrochromic display device which is a display device comprising a solid top transparent, charge conducting material, positioned below the transparent solid material is an active layer comprising an electrochromic material and an electrolyte, and positioned below the active layer is a working electrode and a counter-electrode arranged to be isolated from one another, wherein the distance between the working and the counter electrode is greater than two times the thickness of the active layer between the electrode and the conductive material.

U.S. Pat. No. 4,014,602, incorporated by reference in its entirety herein, describes an identification card having a hologram superimposed on printed data. A falsification-proof identity card comprises a first transparent layer on the underneath side of which conventional data is applied by printing technology. The card contains a holographic safeguard and additional safety measures such as metal structures, fluorescent structures, safety imprints and the like which are only visible in response to holographic reconstruction and/or other light applications, such as ultra-violet light. The holographic safeguard comprises a second transparent or non-transparent layer which carries on the entire surface which faces the first layer a phase hologram or an amplitude hologram which can be read out by light transmission or by light reflection, depending on the transparency of the layer, and which contains at least the visible data printed on the first layer in a direct recording.

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

chip As used herein, the word "chip" can encompass many configurations of a silicon die or a packaged chip. The silicon die for example can have metalized bumps to facilitate the direct connection of the wire ends of an antenna to form a transponder or tag device. A package chip can include various structures such as a tape automated bonding module, a chip module, a flip chip module, a lead frame, a chip carrier, a strap, an interposer or any form of packaging to facilitate transponder manufacturing.

e-paper Electronic paper, also called e-paper, is a display technology designed to mimic the appearance of ordinary ink on paper. Unlike a conventional flat panel display, which uses a backlight to illuminate its pixels, electronic paper reflects light like ordinary paper and is capable of holding text and images indefinitely without drawing electricity, while allowing the image to be changed later.

To build e-paper, several different technologies exist, some using plastic substrate and electronics so that the display is flexible. E-paper is considered more comfortable to read than conventional displays. This is due to the stable image, which does not need to be refreshed constantly, the wider viewing angle, and the fact that it uses reflected ambient light. While it has a similar contrast ratio to that of a newspaper and is lightweight and durable, it still lacks good color reproduction.

Flexible display cards enable financial payment cardholders to generate a one-time password to reduce online banking and transaction fraud. Electronic paper could offer a flat and thin alternative to existing key fob tokens for data security.

Faraday Cage A Faraday cage or Faraday shield is an enclosure formed by conducting material, or by a mesh of such material. Faraday cages shield the interior from external electromagnetic radiation if the conductor is thick enough and any holes are significantly smaller than the radiation's wavelength. This application of Faraday cages is explained under electromagnetic shielding.

Ferrite Ferrite or alpha iron ($\alpha$-Fe) is a materials science term for iron, or a solid solution with iron as the main constituent, with a body centered cubic crystal structure. It is the component which gives steel and cast iron their magnetic properties, and is the classic example of a ferromagnetic material.

inlay An inlay substrate typically has a plurality, such as array of transponder sites on a substrate which matches the position of the data or graphics on a printed sheet or holder/cover page of a smart card or electronic passport respectively. A secure inlay is similar to a conventional inlay but with additional features such as an additional RFID chip on the transponder site storing information about the production processes in the value chain as well as having personalization features integrated into the inlay such as a hologram, an anti-skimming material or security codes embedded into the inlay.

ISO 7810 Defines the size and shape of cards. All credit cards and debit cards, and most ID are the same shape and size, as specified by the ISO 7810 standard. Smart cards follow specifications set out in ISO 7816, and contactless smart cards follow the ISO 14443 specification.

ISO 7816 Regarding smart card, ISO7816 defines specification of contact interface IC chip and IC card.

ISO 10536 Defines the operation of close coupling for contactless cards

ISO 14443 ISO 14443 RFID cards; contactless proximity cards operating at 13.56 MHz in up to 5 inches distance. ISO 14443 defines the contactless interface smart card technical specification.

ISO 15693 ISO standard for contactless integrated circuits, such as used in RF-ID tags. ISO 15693 RFID cards; contactless vicinity cards operating at 13.56 MHz with up to 20 inches of read range. (ISO 15693 is typically not used for financial transactions because of its relatively long range as compared with ISO 14443.)

Latin A human language. Latin terms (abbreviations) may be used herein, as follows:
  cf. short for the Latin "confer". As may be used herein, "compare".
  e.g. short for the Latin "exempli gratia". Also "eg" (without periods). As may be used herein, means "for example".
  etc. short for the Latin "et cetera". As may be used herein, means "and so forth", or "and so on", or "and other similar things (devices, process, as may be appropriate to the circumstances)".
  i.e. short for the Latin "id est". As may be used herein, "that is".
  sic meaning "thus" or "just so". Indicates a misspelling or error in a quoted source.

OTP short for one-time password. The purpose of a one-time password (OTP) is to make it more difficult to gain unauthorized access to restricted resources, like a computer account. Traditionally static passwords can more easily be accessed by an unauthorized intruder given enough attempts and time. By constantly altering the password, as is done with a one-time password, this risk can be greatly reduced.
  There are basically three types of one-time passwords: the first type uses a mathematical algorithm to generate a new password based on the previous, a second type that is based on time-synchronization between the authentication server and the client providing the password, and a third type that is again using a mathematical algorithm, but the new password is based on a challenge (e.g. a random number chosen by the authentication server or transaction details) and a counter instead of being based on the previous password.

QTC short for Quantum Tunneling Composite. QTCs are composite materials of metals and elastomeric binder, used as pressure sensors. As the name implies, they operate using quantum tunneling: without pressure, the conductive elements are too far apart to conduct electricity. When pressure is applied, they move closer and electricity can tunnel across the insulator. The effect is far more pronounced than would be expected from classical (non-quantum) effects alone, as classical resistance is linear (proportional to distance), while quantum tunneling is exponential with decreasing distance, allowing a factor of up to $10^{12}$ difference between pressured and un-pressured states.

RFID Short for "Radio Frequency Identification". An RFID device interacts, typically at a limited distance, with a "reader", and may be either "passive" (powered by the reader) or "active" (having its own power source, such as a battery).

SI units The SI system of units defines seven SI base units: fundamental physical units defined by an operational definition, and other units which are derived from the seven base units, including:
  kilogram (kg), a fundamental unit of mass
  second (s), a fundamental unit of time
  meter, or metre (m), a fundamental unit of length
  ampere (A), a fundamental unit of electrical current
  kelvin (K), a fundamental unit of temperature
  mole (mol), a fundamental unit of quantity of a substance (based on number of atoms, molecules, ions, electrons or particles, depending on the substance)
  candela (cd), a fundamental unit luminous intensity
  degrees Celsius (° C.), a derived unit of temperature. t° C.=tK−273.15
  farad (F), a derived unit of electrical capacitance
  henry (H), a derived unit of inductance
  hertz (Hz), a derived unit of frequency
  ohm ($\Omega$), a derived unit of electrical resistance, impedance, reactance
  radian (rad), a derived unit of angle (there are $2\pi$ radians in a circle)
  volt (V), a derived unit of electrical potential (electromotive force)
  watt (W), a derived unit of power Smart Card A smart card, chip card, or integrated circuit card (ICC), is defined as any pocket-sized card with embedded integrated circuit(s) which can process information. This implies that it can receive input which is processed—by way of the ICC applications—and delivered as an output. There are two broad categories of ICCs. Memory cards contain only non-volatile memory storage components, and perhaps some specific security logic. Microprocessor cards contain volatile memory and microprocessor components. The card is made of plastic, generally PVC, but sometimes ABS. The card may embed a hologram to avoid counterfeiting. Using smartcards also is a form of strong security authentication for single sign-on within large companies and organizations.
  Dimensions are normally credit card size. The ID-1 of ISO/IEC 7810 standard defines them as 85.60×53.98 mm. Another popular size is ID-000 which is 25×15 mm. Both are 0.76 mm thick.
  Contact smart cards have a contact area, comprising several gold-plated contact pads, that is about 1 cm square. When inserted into a reader, the chip makes contact with electrical connectors that can read information from the chip and write information back. The cards do not contain batteries; energy is supplied by the card reader.
  A second type of smart card is the contactless smart card, in which the chip communicates with the card reader through RFID induction technology (at data rates of 106 to 848 kbit/s). These cards require only close proximity to an antenna to complete transaction. They are often used when transactions must be processed quickly or hands-free, such as on mass transit systems, where smart cards can be used without even removing them from a wallet.
  The standard for contactless smart card communications is ISO/IEC 14443, dated 2001. It defines two types of contactless cards ("A" and "B"), allows for communications at distances up to 10 cm. An alternative standard for contactless smart cards is ISO 15693, which allows communications at distances up to 50 cm.

transponder As used herein, a transponder is an RFID chip or module (either passive or active) connected to an antenna.

Units of Length Various units of length may be used or referred to herein, as follows:

meter (m) A meter is the SI unit of length, slightly longer than a yard. 1 meter=~39 inches. 1 kilometer (km)=1000 meters=~0.6 miles. 1,000,000 microns=1 meter. 1,000 millimeters (mm)=1 meter. 100 centimeters (cm)=1 meter.

micron (μm) one millionth of a meter (0.000001 meter); also referred to as a micrometer.

mil $\frac{1}{1000}$ or 0.001 of an inch; 1 mil=25.4 microns.

nanometer (nm) one billionth of a meter (0.000000001 meter).

SUMMARY (BRIEF DESCRIPTION) OF THE INVENTION

According to the invention, generally, a contactless smart card may be provided with anti-skimming measures to prevent any unauthorized interrogation of the radio frequency communication.

According to an embodiment of the invention, generally, a first antenna is connected to a transponder chip, and is detuned. The transponder is brought into resonance with a reader by a second, "matching" antenna.

A switch may be connected in series with the second antenna to switch the second antenna on or off.

A capacitor in series with the switch may tune the second antenna.

A "capacitor switch" may comprise a button on the front of the contactless card comprising one electrode of a capacitor, and a second electrode within the card. When the button is depressed, the capacitance increases, and tunes the second antenna.

The second antenna may be referred to as a "matching" antenna, or "boosting" antenna, or "coupling" antenna, or "compensating" antenna. Generally, a sort of transformer is formed by the first antenna (connected to the chip) and the second, matching antenna.

The chip and first antenna may be molded in a mass, and inserted into a recess of an inlay which already has the second antenna formed therein. And, this can be in conjunction with a hologram, such as the hologram found on a Visa™ card.

The switch may be incorporated into an underlying layer of the inlay, such as under the hologram (and mass with chip and first antenna). The switch may selectively connect (or disconnect) the second, matching antenna. Alternatively, the switch may selectively connect (or disconnect) the first antenna.

According to an embodiment of the invention, a smart card comprises: a multi-layer substrate; a transponder module disposed in a first layer of the multi-layer substrate; a first antenna disposed in the first layer of the multi-layer substrate; and a second antenna disposed in a second layer of the multi-layer substrate. A switch may be disposed in (or on) the second layer of the multi-layer substrate, for selectively connecting or disconnecting wire ends of the second antenna. A capacitor may be disposed in (or on) the second layer of the multi-layer substrate, in series with an end of the second antenna.

The first antenna may be tuned to a different frequency than the second antenna. For example. The first antenna may be tuned to a first frequency which is relatively far from a desired resonant frequency, and the second antenna may be tuned to a frequency which is relatively close to the desired resonant frequency. The first antenna may be tuned to approximately 50 MHz, and the second antenna may be tuned to approximately 14.5 MHz; and the desired resonant frequency may be approximately 13.56 MHz. (ref ISO 14443).

The first antenna may comprise 1 turn of wire, and the second antenna may comprise several turns of wire. The first antenna may have a relatively low Q factor, and the second antenna may have a relatively high Q factor. The first antenna may have a relatively low inductivity, and the second antenna may have a relatively high inductivity.

A switch and a capacitor may be connected in series with the second antenna. The switch may be selected from the group consisting of a toggle switch, a slide switch, a QTC switch, a piezo film switch and a touch sensor switch.

According to an embodiment of the invention, a smart card comprises: a multi-layer substrate having a first layer and a second layer; an RFID chip and antenna disposed in a recess in the first layer of the substrate; and a hologram disposed on the first layer of the substrate. The RFID chip may be disposed on a carrier. The antenna may be incorporated on the RFID chip. The chip and antenna may be disposed in a mold mass. The second antenna may be disposed on the second layer. The smart card may comprise
a switch for switching the second antenna on and off, to control unauthorized access to the smart card. The switch may be disposed under the RFID chip. A layer of ferrite material may be disposed between the hologram and the RFID chip. LEDs may be disposed behind the hologram.

In another aspect of the invention, a display may be incorporated into the card. The display should be of the flexible type which can bend with the movement of the card. When a display is incorporated into the card, the card should be an "active" card, having a power source (in contrast with the passive card discussed above, which is powered by a reader).

BRIEF DESCRIPTION OF THE DRAWINGS

Reference will be made in detail to embodiments of the disclosure, examples of which may be illustrated in the accompanying drawing figures (FIGs). The figures are intended to be illustrative, not limiting. Although the invention is generally described in the context of these embodiments, it should be understood that it is not intended to limit the invention to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

Figure 1A:
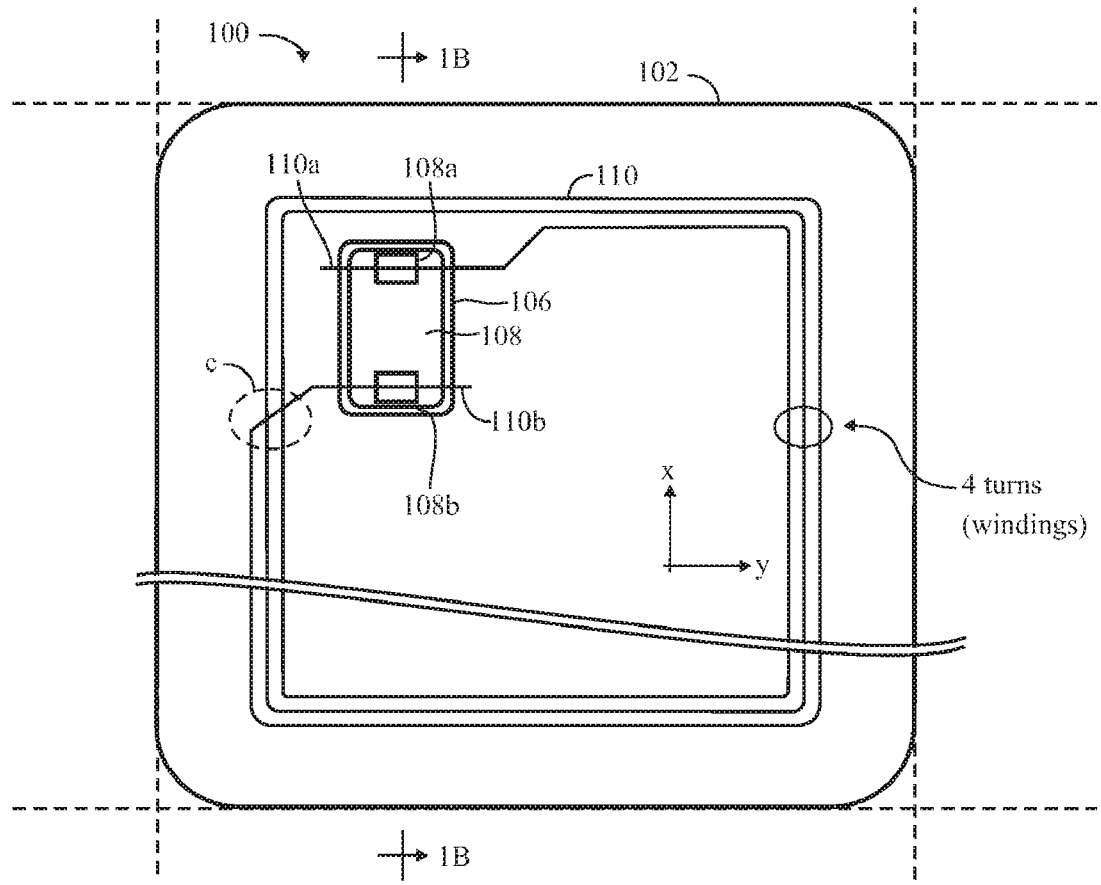

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 (FIG. 1) are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

FIG. 1A is a top view of an inlay with transponder chip (or module) and antenna, according to the prior art.

Figure 1B:
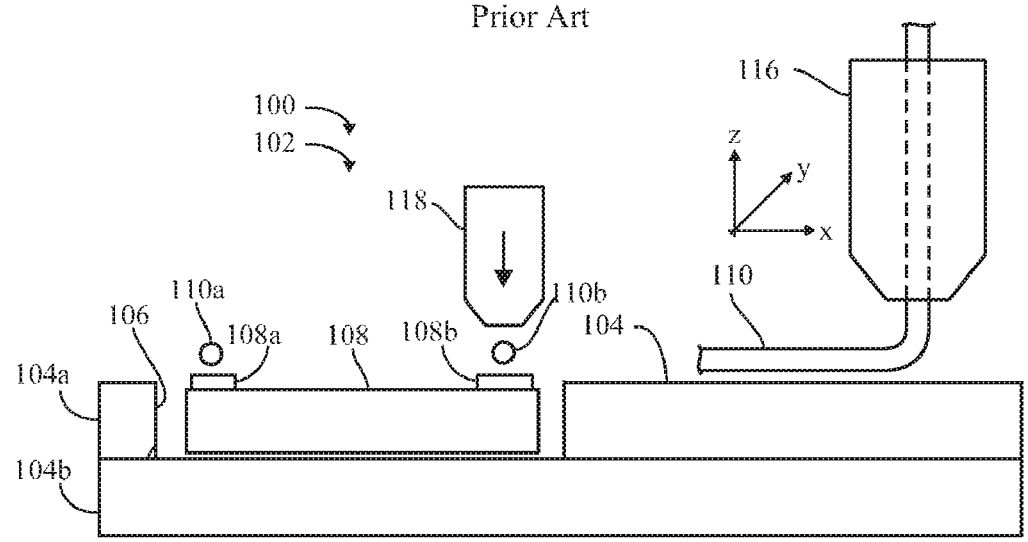

FIG. 1B is a cross-sectional view of the inlay of FIG. 1A, according to the prior art.

Figure 2A:
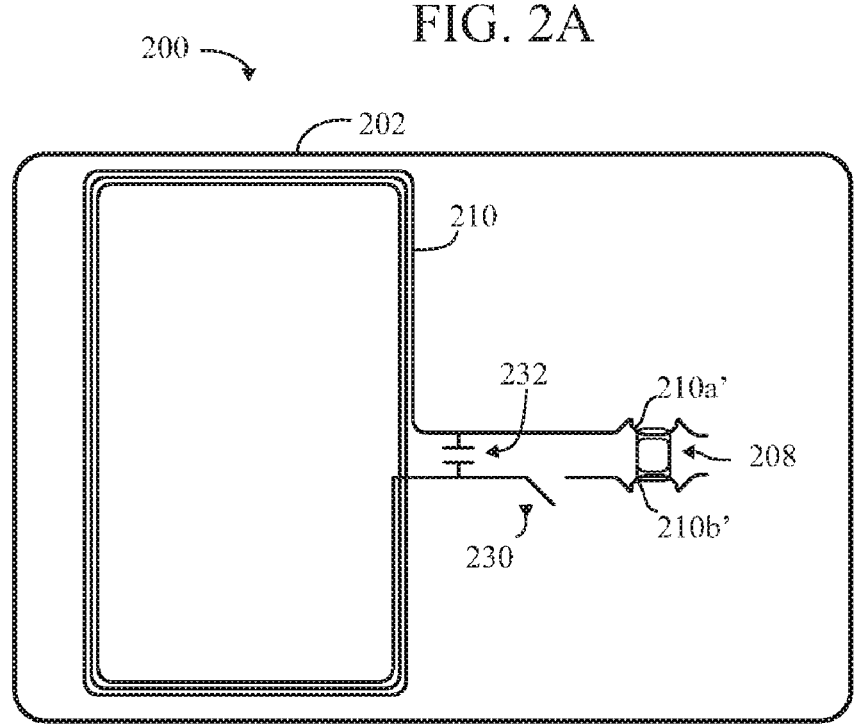

FIG. 2A is a top view (including partially schematic) of an inlay with transponder chip (or module) and antenna, according to an embodiment of the invention.

Figure 2B:
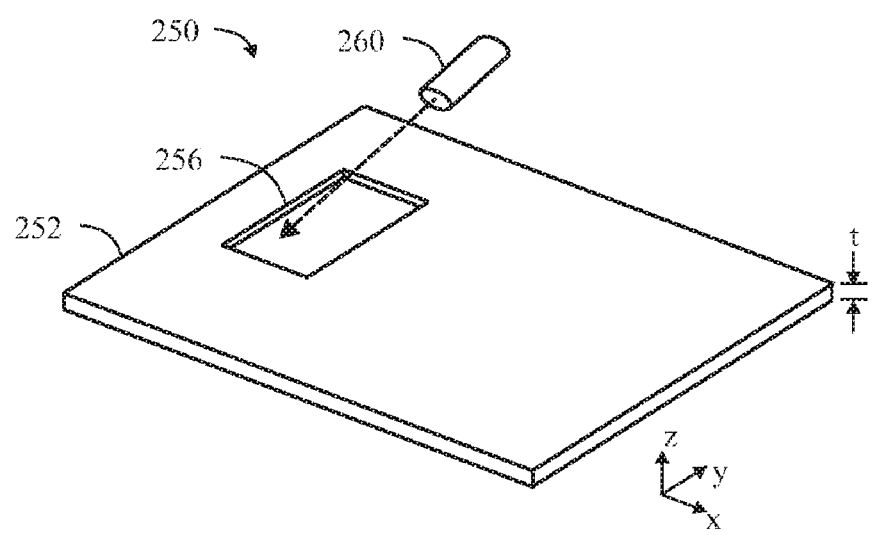

FIG. 2B is a perspective view of a substrate for an inlay, having a recess formed therein, according to an embodiment of the invention.

Figure 3A:
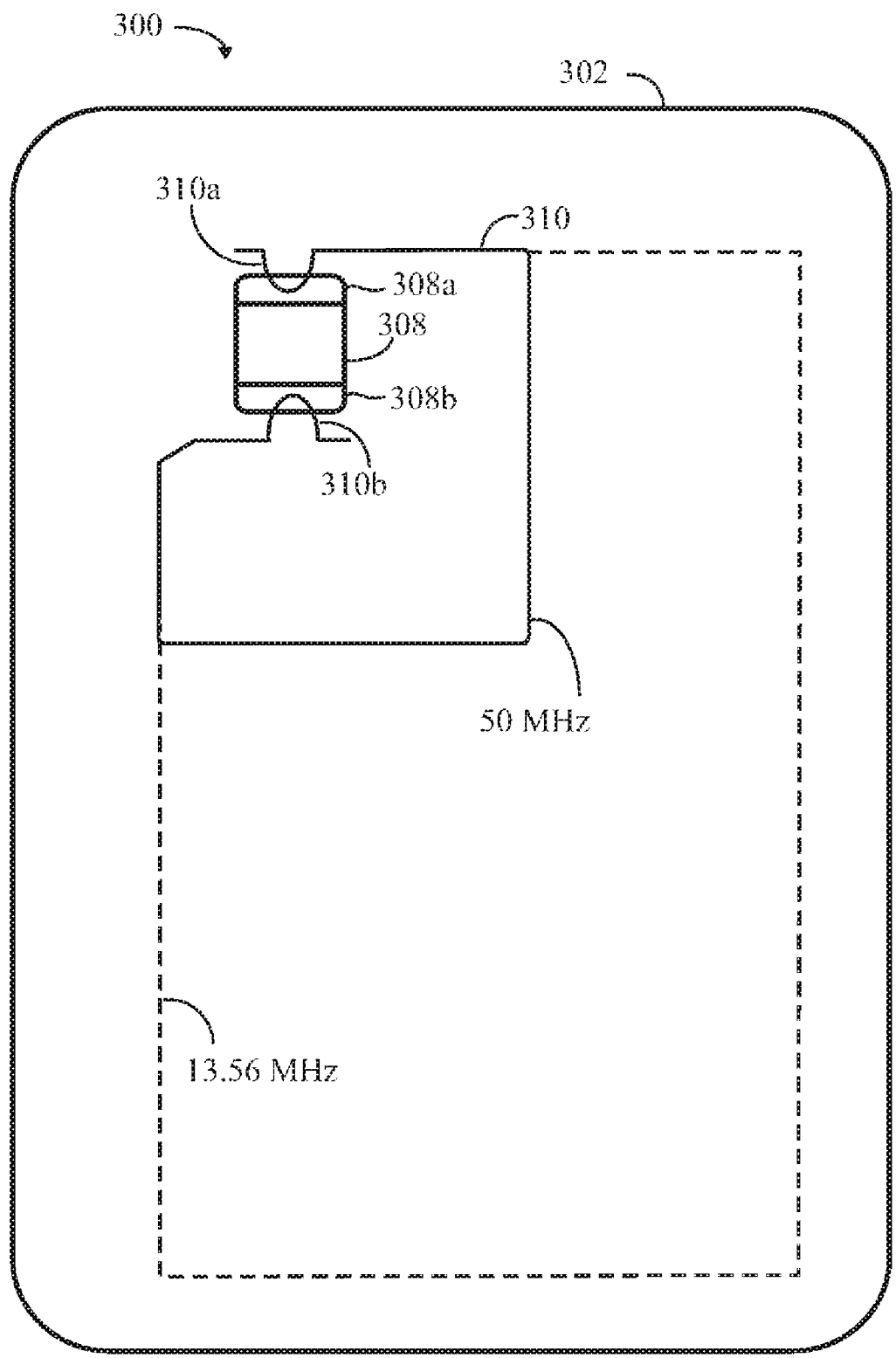

FIG. 3A is a top view of a substrate (or layer) for an inlay, according to an embodiment of the invention.

Figure 3B:
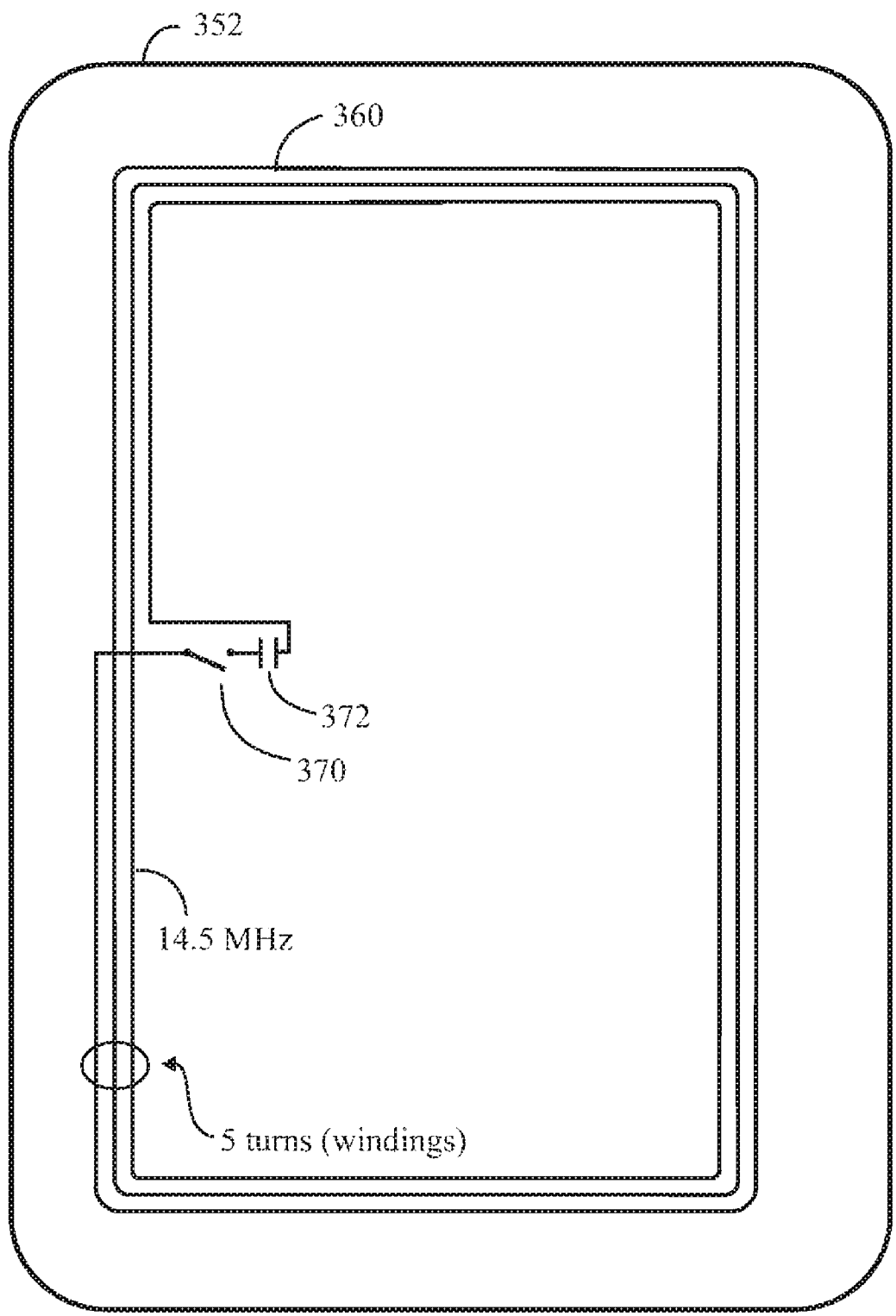

FIG. 3B is a top view (including partially schematic) of a substrate (or layer) for an inlay, according to an embodiment of the invention.

Figure 3C:
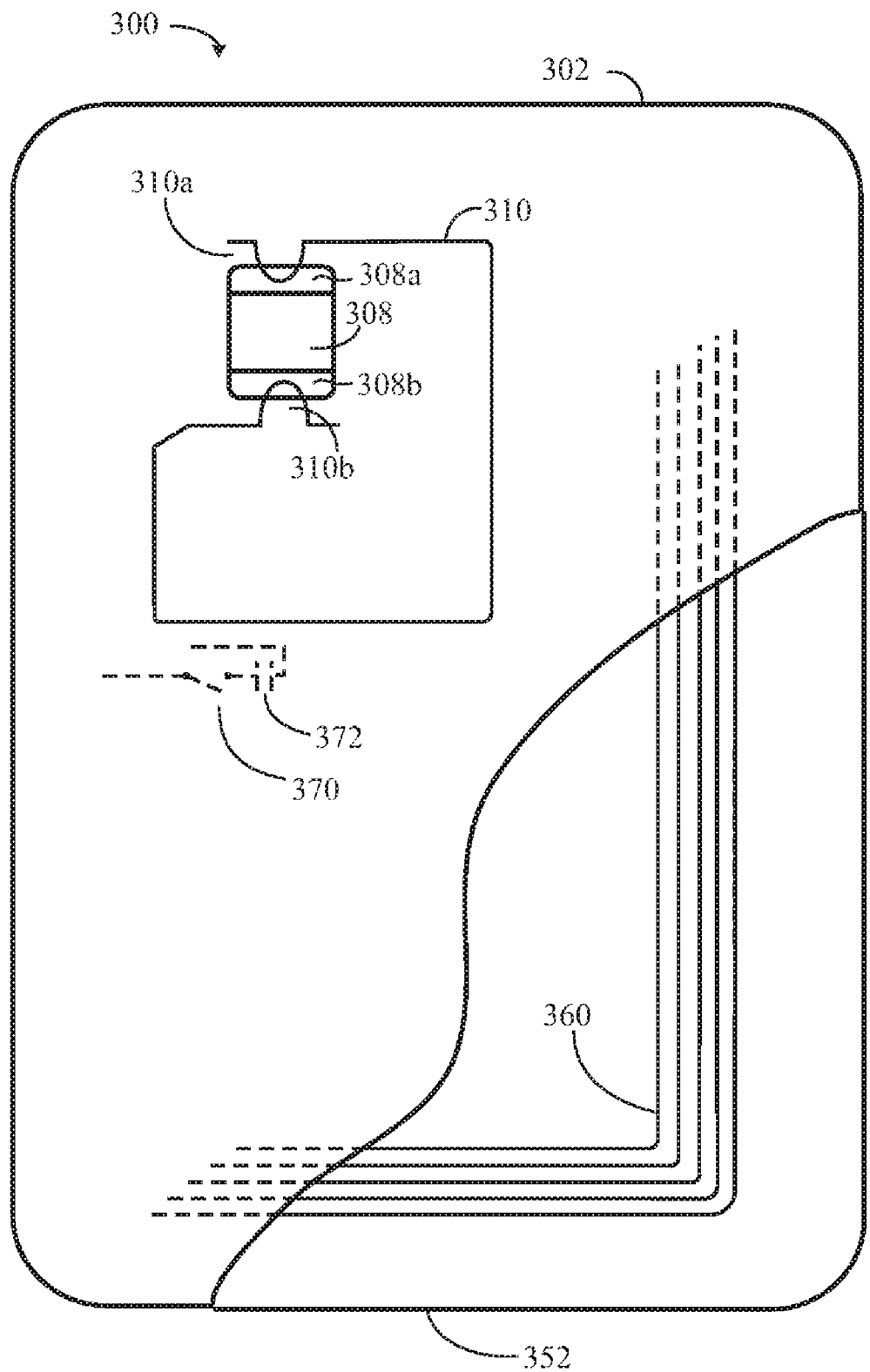

FIG. 3C is a top view, partially broken away, of an inlay, comprising the substrates of FIGS. 3A and 3B, according to an embodiment of the invention.

Figure 4A:
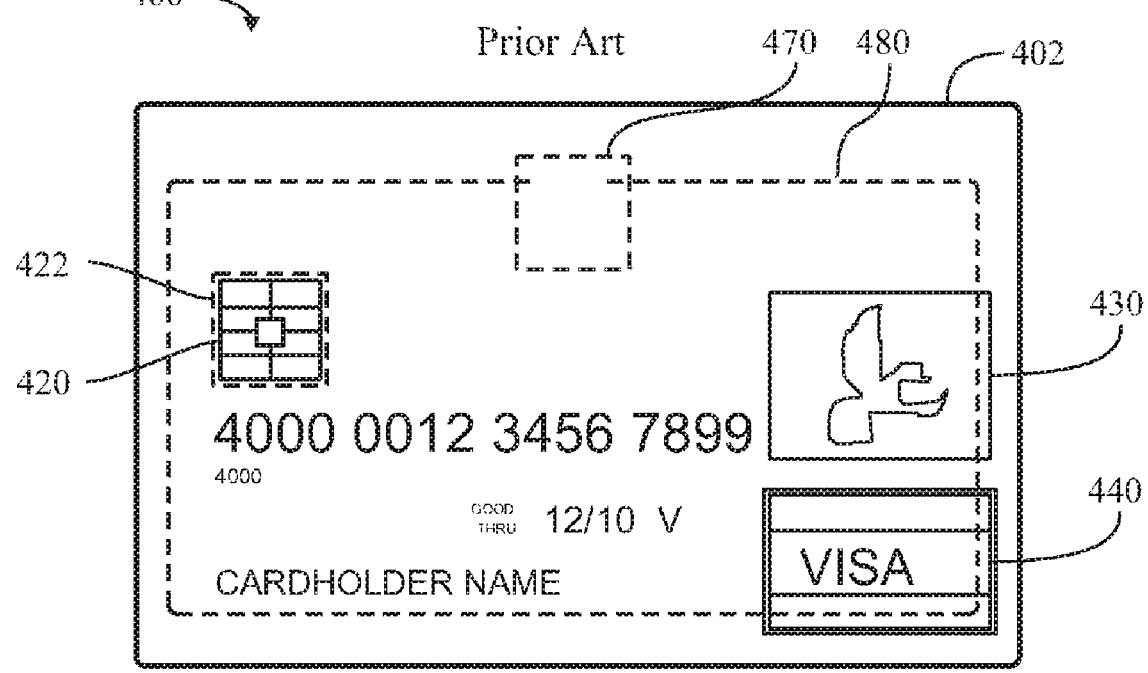
Figure 4B:
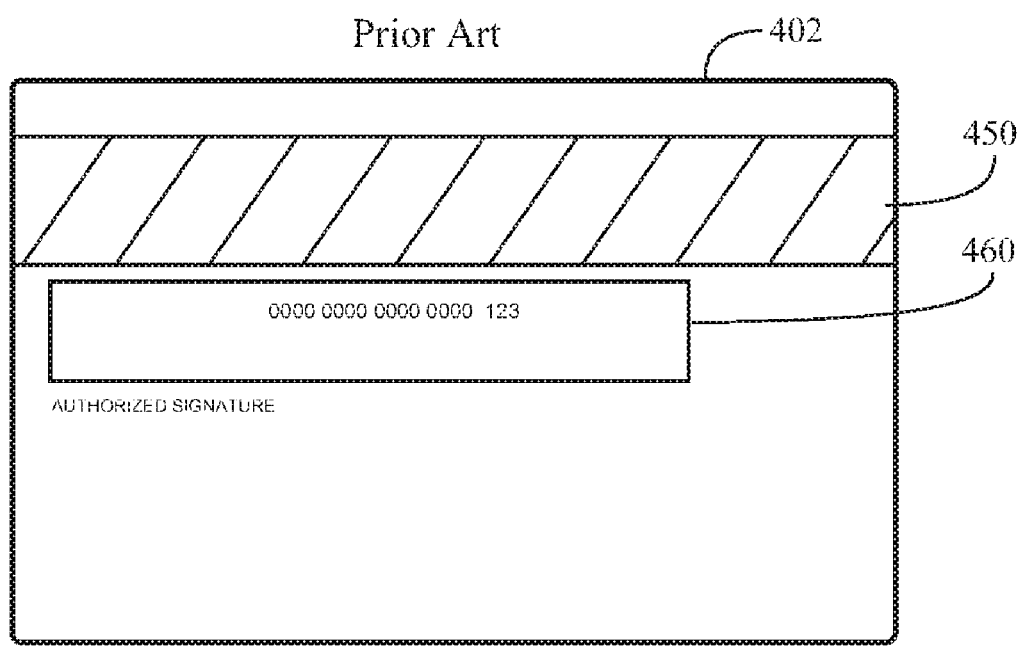

FIGS. 4A and 4B are front and back views of a typical credit card, according to the prior art.

FIG. 5 is a cross-sectional view (exploded) of a portion of a smart card in credit card format, according to an embodiment of the invention.

DETAILED DESCRIPTION OF THE INVENTION

Various "embodiments" of the invention will be discussed. An embodiment is an example or implementation of one or more aspects of the invention(s). Although various features of the invention may be described in the context of a single embodiment, the features may also be provided separately or in any suitable combination. Conversely, although the invention may be described herein in the context of separate embodiments for clarity, the invention may also be implemented in a single embodiment.

It should be understood that the phraseology and terminology employed herein is not to be construed as limiting, and is for descriptive purposes only.

THE INVENTION AND SOME EMBODIMENTS, GENERALLY

The invention relates generally to secure inlays (such as secure cards, or passport) which may be single or multi-layer substrates containing HF (high frequency) and/or UHF (ultra-high frequency) radio frequency identification (RFID, transponder) chips. In the production of an RFID inlay, an antenna is mounted or formed on a substrate and the end portions of the antenna are connected to an RFID chip, to produce a transponder unit.

In the main, hereinafter, inlays which are secure cards such as credit cards are discussed. In the main hereinafter, "passive" cards which receive their power from an external reader are discussed. This is in contrast to "active" cards which have their own internal power source, such as a battery), although many of the techniques disclosed herein may be applicable to either passive or active smart cards.

In conventional contactless cards the RFID chip module is mounted on an inlay and sandwiched between upper and lower layers of synthetic material, before lamination. After the lamination process, the RFID chip module is buried within the card body and not visible from the front or back surface side of the card.

In an embodiment of the invention, a second antenna is mounted or formed either over or under the transponder unit on the same substrate or on an additional substrate close to the transponder unit. The second antenna may boost the performance (read/write range) of the secure card.

In an embodiment of the invention, the first antenna which is connected to the transponder chip is de-tuned so that the secure card would be essentially non-functional, to avoid unwanted interrogations such as skimming (unauthorized reading). And, the second antenna is designed to interact with the first antenna to re-tune the inlay, so that it can be used (for contactless payment). A switch may be provided to disconnect either of the first or second antennas, when the user does not want the secure card to be surreptitiously interrogated.

It should be highlighted that the antenna of a transponder unit is normally tuned to a resonance frequency which correlates to the operating frequency of the RFID chip. In the case of a high frequency transponder unit, this frequency is 13.56 MHz. As described in greater detail hereinbelow, in the case of two antennas, the first antenna which is connected to the RFID chip is detuned so as not to be in resonance, and the second antenna (when connected) establishes resonance.

A pressure switch may be used to initiate a contactless payment and may be a QTC switching device connected in series with the antenna. When the QTC switch is compressed, its resistance becomes lower and the transponder unit can communicate with a reader. The QTC switching device is a flexible polymer. In its normal state it is a substantially perfect insulator, but when compressed it becomes a more or less perfect conductor and able to pass high currents.

Other embodiments and features are discussed below, and it should be understood that various embodiments, or portions thereof, may be combined with various other embodiments or portions thereof.

BRIEF DISCUSSION OF RELATED APPLICATIONS

This application claims priority of various previously filed applications, all of which are incorporated by reference herein. Some of the features disclosed therein may include, but are not limited to, the following.

U.S. Provisional 60/968,901 filed Aug. 30, 2007 by Finn ("S13 ppa") discloses an inlay having (FIG. 1) a first layer comprising a transponder and a first antenna, and (FIG. 2) a second layer comprising a second antenna, a switch and a capacitor.

U.S. patent application Ser. No. 11/779,299 filed 18 Jul. 2007 by Finn ("C18") discloses a method to increase the read/write range of an ID card or ID fob using a compensating antenna integrated into a plastic sleeve or around the perimeter of a portable reader.

U.S. Provisional 60/883,064 filed 1 Jan. 2007 by Finn ("S5 ppa") discloses using a switch to disconnect the antenna.

U.S. patent application Ser. No. 12/045,043 filed Mar. 10, 2008 by Finn ("S16") discloses (FIG. 8) a technique for forming a recess in a substrate, using laser milling.

U.S. patent application Ser. No. 11/733,756 filed 10 Apr. 2007 by Finn ("S9") discloses forming an inlay comprising an antenna wire having two end portions and a site for a transponder chip, comprises: mounting the wire to a surface of substrate; and leaving the end portions of the antenna wire free-standing, as loops adjacent terminal areas of a site on the substrate for the transponder chip. With the transponder chip installed on the substrate, the free-standing loops are repositioned to be substantially directly over the terminals of the transponder chip, in preparation for interconnection of the loops to the terminals of the transponder chip, then are bonded to the terminals. An embedding tool for mounting the wire on the substrate may embed the wire in or adhesively place a self-bonding wire on a surface of the substrate. The substrate may have two transponder chips, and function as a secure inlay. An anti-skimming feature is included in the inlay.

Mounting Antenna wire to a Substrate, and Connecting to the Transponder Module

Various techniques are well-known for mounting an antenna wire to a substrate, including embedding the wire in a surface of the substrate and adhesively securing the antenna wire to the surface of the substrate.

For example, U.S. Pat. No. 6,698,089 ("089"), incorporated by reference in its entirety herein, discloses device for bonding a wire conductor.

For example, U.S. patent application Ser. No. 11/733,756 filed 10 Apr. 2007 by Finn ("S9"), incorporated by reference in its entirety herein, discloses various techniques for mounting the antenna wire conductor to the substrate, and connecting ends of the antenna wire to the transponder module.

Anti-Skimming Switch

U.S. Provisional 60/883,064 filed 1 Jan. 2007 by Finn ("S5 ppa") discloses using a switch to disconnect the antenna. FIG. 2B therein is reproduced herein as FIG. 2A.

FIG. 2A discloses an inlay substrate 200 comprising a transponder site 202 (compare 102), and an HF antenna 210 with ends 210a/b connected to terminals of an HF chip module 208 (compare 108). A switch 230 and a capacitor 232 are provided, and connected as shown. The purpose of the switch 230 is to "deactivate" the antenna, by disconnecting it from the chip module. Disconnecting the antenna by causing the switch to be open can prevent "skimming" (unauthorized, surreptitious contactless interaction with the smart card).

S5 ppa also discloses a contactless smart card or fob comprising a high frequency transponder site including at least one chip, at least one antenna and a pressure sensitive switch to disconnect the antenna from the chip or short circuit the antenna close to the chip.

A transponder site can include other components such as a display, capacitor, rechargeable battery or an anti-skimming switch. The switch may be used to prevent unauthorized reading of the data stored in the memory of the RFID chip or to connect a capacitor or battery. The switching mechanism can be integrated either to short circuit the antenna close to the RFID chip or to disconnect the antenna. The switching components may be located at the surface of a contactless card or fob and at the inlay level where the antenna is positioned.

By pressing the switch on the front surface a short circuit is lifted or a connection is made between the antenna and the RFID chip. The antenna can be a silver coated copper wire, conductive ink, aluminum etched or copper etched which can be electrically contacted to the switch.

To ensure a proper connection between the antenna and the switch, the wire conductor can be routed in a zigzag manner under the contact elements of the switch. A capacitor or a rechargeable battery can be used to energize the RFID chip when the switch is activated.

Regarding a suitable switch, the company Peratech Ltd (Brompton on Swale, RICHMOND, DL10 7JH, UK) has developed a range of standard switching and sensor products based on quantum tunneling composite technology. In force-sensitive switches, the polymer material exhibits a rapid decrease in electrical resistance as pressure is applied. (www.peratech.co.uk) For energy harvesting, a solar cell or a mains coupling antenna can be connected to a rechargeable battery or capacitor for the purpose of powering up a transponder in a remote location. (This would generally relate to an active card.)

Also, a transponder site can include two RFID chips operating at different frequencies such as at 125 KHz, 450 KHz, 13.5 MHz, or at ultra-high frequency. The first transponder can wake up the second transponder when in an electromagnetic field, and thus powering up the second transponder to transmit data over a greater distance or at a higher data rate. (This would generally relate to an active card.)

Creating a Recess

In the case of a multi-layer substrate, such as 104 (FIG. 1B), a recess 106 may be formed punching out a hole completely through one layer 104a of the substrate. A chip 108 inserted into the recess 106 will be supported by an underlying layer 104b.

A recess may be formed in the substrate using an ultrasonic stamp process. The recess may be "stepped", so that a chip module which is disposed in the recess will not fall through, even if the recess extends all the way through the sheet.

A recess may be formed in the substrate using a high speed milling tool, which may also create a stepped recess in the substrate.

Generally, a recess which extends completely through a substrate may be referred to as a "hole", and a recess that does not extend completely through the substrate may be referred to as a "pocket". In the case of a pocket recess, the recess will, of course, have a depth that is less than the thickness of the substrate.

U.S. patent application Ser. No. 12/045,043 filed Mar. 10, 2008 by Finn ("S16") discloses (FIG. 8) a technique for forming a recess in a substrate, using laser milling. This is reproduced herein as FIG. 2B, and applies to "holes" and "pockets".

FIG. 2B illustrates an exemplary process 250 of forming a recess 256 (compare 106) in a substrate 252 (compare 102, 202), using a laser 260. The substrate 202 may be a single layer of Teslin (for example), having a thickness "t" of 355 μm in the z-direction, and measuring 183 mm×405 mm (3up format) in the x- and y-directions. A typical size for the recess 256, to accommodate a chip with lead frame, may be approximately 5 mm×8 mm, by 260 μm deep.

The laser 260 emits a beam (dashed line), targeted at the substrate 202, to ablate material from the substrate 202 to form the recess 206. The beam may have a diameter of approximately 0.1 mm. The beam may be scanned back and forth, traversing in one direction entirely across the recess area, turning around, and traversing back across the recess area, like plowing a field. Many passes may be required to carve out the entire area of the recess, given that the beam diameter is typically much (such as 10-100 times) smaller than the length or width of the recess. As is known, the beam may be scanned, in any suitable manner, such as with mirrors. Also, the intensity of the beam may be controlled or modulated to control the penetration into the substrate. For example, a pulse-width modulated beam may be used. The laser may be a UV laser (355 nm) with a power ranging from 20 to 70 watts.

The process of using a laser in this manner, rather than (for example) a conventional rotating milling tool, may be referred to as "laser milling". The technique described herein may be particularly beneficial for applications where it is desired to form a "pocket" type recess which intentionally does not extend all the way through the substrate or sheet (in other words, the recess or pocket extends only partially through the substrate). Mechanical milling can be difficult. On the other hand, laser milling can be very effective for Teslin and polycarbonate substrates. For PVC, laser milling is less effective.

Embodiment 1

A first embodiment of the current invention is directed to a combination of a switching element, an RFID transponder unit and a coupling antenna to boost the performance of the transponder unit. Optionally, an LED can be integrated to signal the activation of the switching element. A capacitor can also be used to improve the Q-factor of the boosting antenna.

Generally, FIGS. 3A, 3B and 3C herein correspond with FIGS. 1, 2 and 3 of S13 ppa.

FIG. 3A shows an inlay 300, comprising a substrate 302. A transponder chip (or module) 308 (compare 108) is mounted to the substrate 302 (or in a recess, not shown). An antenna wire 310 (compare 110) is mounted to the substrate 302, and end portions_310a/b of this "first" antenna 310 are bonded to terminals 308a/b (compare 108a/b) of the transponder chip 308.

Recall that the antenna 110 (FIG. 1A) of the prior art is formed to be resonant at 13.56 MHz, for ISO 14443, and was formed with several (4 or 5) turns of wire approximately the same size as the substrate (typically, a credit card format).

According to a feature of the invention, the first antenna 310 may comprise 1 turn (winding) of 112 micron wire and have a resonant frequency of approximately 50 MHz, with a Q factor (without module 110) of approximately 28, and an inductivity of approximately 330 nH (nanoHenry).

The one turn of the antenna 310 may be significantly smaller than the substrate, and may be only slightly larger than the chip module. The antenna may, of course, comprise more than one turn of wire.

The size of a "conventional", 13.56 MHz antenna, such as 110 (refer to FIG. 1), is shown in dashed lines (and would typically comprise 4 or 5 turns/windings).

The antenna 310 of the transponder unit (RFID chip connected to an antenna) is advertently not tuned to the operating frequency of the RFID chip, but rather the antenna has a very high resonance frequency in the region of 50 MHz with a low Q-factor (28) and very low induction properties (e.g. 330 nano-Henry). This can be achieved for example with one winding (or turn) of wire mounted onto or into a substrate layer, as part of an inlay. As the antenna is not tuned to the RFID chip, it is not possible to power up the chip from the electromagnetic field generated by the reader, and thus no data will be transmitted.

FIG. 3B shows another substrate 352, such as a second layer of the inlay 300. A "second" antenna 360 is mounted to this layer 352. This "second" antenna 360 is similar to the antenna 110 (see FIG. 1A), but is not connected to the transponder module.

The second antenna 360 has several turns of wire (e.g. 5 windings), with a resonance frequency close to the operating frequency of the chip (e.g. 14.5 MHz), a high Q-factor (70) and high induction (e.g. 5.8 Micro Henry).

A switch 370 (shown schematically) is provided, comparable to the switch 230 (see FIG. 2A). A capacitor 372 (shown schematically) is provided, comparable to the capacitor 232 (see FIG. 2A), in series with an end of the antenna 360. The switch 370 connects the wire ends of the antenna, via the capacitor 372, for selectively switching the antenna 360 on and off. If the capacitor is not there, this means selectively connecting or disconnecting the ends of the antenna wire.

The capacitor 372 is optional, may have a capacitance of 10-20 Pico Farad, and may be added to achieve a high Q-factor, but through suitable spacing of the wire conductors that form the antenna or by integrating an additional antenna, the capacitive effect can also be accomplished without an additional (discrete) capacitor.

The "second" antenna 360 may comprise:
5 turns of wire (coated)
diameter 80-112 μm
length and width, approximately perimeter of credit card
  approx 80×48 mm
  each turn ~150 mm and there are 5 of them
pitch 0.46 mm The second antenna 360 may have 5 windings of 112 micron wire and have a resonant frequency of approximately 14.5 MHz, with a Q factor (without module 110) of approximately 70, an inductivity of approximately 5.8 μH (microHenry). There is a switch (SW) and a capacitor (C) having a capacitance of approximately 10-20 pf (picoFarad) connected in series with the antenna windings, as shown.

This "second" antenna 360 works in conjunction with the "first" antenna 310 (FIG. 3A). When the switch 370 is "on", resonance is achieved (e.g., 13.56 MHz), and the smart card can be interrogated, powered up, and interacted with. Generally, the first antenna is tuned to a frequency (such as 50 MHz) which is relatively far from the desired resonant frequency (13.56 MHz), and the second antenna is tuned to a frequency (such as 14.5 MHz) which is relatively close to the desired resonant frequency (13.56 MHz). In this manner, the 14.5 MHz second antenna 360 interacts with the 50 MHz first antenna 310, resulting in a resonant frequency (or "combined resonance") of 13.56 MHz (ISO 14443).

Regarding the switch 370 and capacitor 372:
  there can be only a switch, and no separate capacitor;
  there can be both a switch and capacitor, as shown; or
  the switch can be a variable capacitor that changes value
    when pressure is applied thereto, and in this manner, the
    second antenna can be brought to its desired value to
    interact with the first antenna and make the smart card
    functional.

FIG. 3C illustrates the layer 352 with second antenna 360 under layer 302. The layer 302 is shown "broken away" to reveal the underlying layer 352. The switch 370 and capacitor 372 in the layer 352 are shown in dashed lines.

By placing the second antenna 360 with switch over or under the first antenna 310 connected to the RFID chip 308, as part of the inlay layout, the performance of the combined antenna arrangement yields a resonance frequency which powers up the transponder, if the switch has connected ("on" position) the antenna to the capacitor. When the switch is in the "off" position, the second antenna cannot absorb sufficient magnetic flux to power up the transponder.

When the inlay is laminated with additional layers of substrate to form a contactless card or fob, the switch can be activated by pressing against the top layer of the final product. The switch can be a toggle switch, a slide switch, a QTC switch, a piezo film switch or a touch sensor switch.

As the transponder unit is not in frequency sync with the reader, unauthorized skimming of the data in the RFID chip is not feasible. Only when the second antenna is activated, is it possible for a reader to interrogate the transponder unit.

A switch for the matching/boosting antenna may be activated such as by the opening of a booklet, so that when the booklet is closed, the anti-skimming feature is active. In the case of an electronic passport, the switch can be activated, for example, when the passport is opened for inspection at cross border control. The transponder unit can be integrated into the cover page with the second antenna. In the case that the transponder unit is integrated into the data page, the coupling antenna can be integrated into the cover or back page to form a Faraday cage around the transponder unit.

There may be 352-type layer (with second antenna for boosting signal) on both sides of the layer 302. (That is, an additional layer, not shown, with an additional antenna.)

Embodiment 2

In another embodiment of the current invention, the second coupling antenna may be short-circuited as a method to attenuate the magnetic flux around the transponder unit. On the other hand, when the switching element is "off", the inductively coupled antenna is left floating, thus boosting the performance of the transponder unit.

An alternative method to the current invention is to put a transponder unit out of tune using a coupling antenna. This can be achieved by having the high frequency coupling antenna resonating at a frequency above or below 13.56 MHz, by the value of the sub-carrier frequency (848 KHz).

Embodiment 3

In another embodiment of the current invention, the RFID chip module is not mounted on a traditional transponder inlay that is subsequently collated with other layers and laminated or otherwise buried within a card body, but rather the RFID chip is prepared with a visible security feature such as a hologram, such as in a credit card format.

FIGS. 4A and 4B show a smart card 400 in credit card format, such as a Visa™ card, according to the prior art. The smart card comprises a substrate 402, which may be a multi-layer substrate (compare 104, FIG. 1B).

Visible on the front side of the card are contact pads 420, a hologram 430, and a logo 440. A card number, expiration date and cardholder's name are also shown in the front side of the card. A magnetic stripe 450 and a signature area 460 are visible on the back side of the card. The magnetic stripe (or strip) 450 allows use with legacy systems.

The contact pads 420 may be on the front surface of a chip (or module) 422 (shown in dashed lines) which is embedded in the card. The chip 422 may be a contact-interface chip.

The card may also (additionally, or alternatively) operate in a contactless mode (e.g., ISO 14443), and may comprise an RFID chip (or module) 470 (compare 108) and an antenna 480 (compare 110) embedded in the card. The chip 470 and antenna 480 are both shown in dashed lines.

The contact chip 422 and contactless chip 470 may be embodied in a single dual interface (DI) chip.

FIG. 5 shows a smart card 500 (compare 400) in credit card format, such as a Visa™ card, according to an embodiment of the invention.

The smart card 500 comprises:
a multi-layer substrate 504, with a first layer 504a (compare 104a, FIG. 1B) and a second layer 504b (compare 104b, FIG. 1B), and
a hologram 530 (compare 430, FIG. 1B).
The smart card 500 further comprises:
an RFID chip or module 508 (compare 108, FIG. 1B) which may be disposed on a separate support or carrier 522, and
an antenna 510 (compare 110, FIG. 1B) having two end portions 510a/b (compare 110a/b, FIG. 1B) connected to corresponding two terminals 508a/b (compare 108a/b, FIG. 1B) of the chip 508.

The antenna 510 may be a "first antenna", which is detuned (not resonant at 13.56 MHz), in the manner of the first antenna 310 of FIG. 3A. Alternatively, the first antenna may be incorporated on the chip ("coil on chip"), in which case no carrier (522) may be needed.

The chip 508 and antenna 510 may be disposed in a mold mass 532. A recess 506 (compare 106, FIG. 1B) may be formed in the front (top, as viewed) surface of the first layer (or substrate) 504a, and may be sized and shaped to receive the mold mass 532. The recess 506 may be formed in any suitable manner, including using a laser, as discussed hereinabove (FIG. 2B).

An antenna 560 is disposed on the second layer 504b. The antenna 560 may be a "second antenna", which is a matching antenna (resonant at 14.5 MHz), in the manner of the second antenna 560 of FIG. 3B, for bringing the transponder into resonance with an external reader (not shown).

A switch 562 (compare 230, FIG. 2A; compare 370, FIG. 3) may be disposed on the second layer 504b and the antenna 560 connected thereto so that the antenna may be switched on and off, to control unauthorized access to the smart card.

Generally, some kind of "button" is needed to apply pressure to the switch 562. The switch 562 may be disposed under the mold mass 532 (hence, under the chip 508, and under the hologram 530), as shown. Notice that the first layer 504a is thinner in this region. (The recess 506 may also extend completely through the first layer 504a.

A layer (thin sheet) 572 containing ferrite material may be disposed between the hologram and the RFID transponder unit, to enhance the magnetic flux in one direction.

The anti-skimming switch can be incorporated into either of the first or second antennas.

The RFID chip module 508 is interconnected to the antenna 510 positioned under the security feature or hologram 530. This so-called Secure Transponder—RFID chip module/transponder/with visible security feature or hologram—is designed to be mounted to a card body by first milling a cavity 506 in the card body to accept the Secure Transponder. Once embedded, the top surface of the Secure Transponder, the surface with the visible security feature or hologram, is flush with the surface of the card body. For security purposes the hologram or security feature may be attached to the RFID chip module using a polyurethane dispersion or hotmelt adhesive which would be visibly damaged if tampered with. The same adhesive can be used to bond the Secure Transponder with the card body. As the RFID chip module is mounted on a flexible substrate, it can be embossed after embedding in the card body. In addition, the Secure Transponder can couple with the booster antenna 560 inside the card body to increase the read/write distance.

The anti-skimming switch can be near the hologram, basically on the bottom right hand side of a credit card, or thereabouts, such as under the logo 440.

The switch (or actuator in the case of a press button switch) could be a slide switch at the position of the VISA logo.

Light Emitting Diodes

Bank cards (credit/debit) with contactless function for micro-payment are usually provided with holograms as a secure feature, and in the present invention using the technique of inductive coupling and energy harvesting, the hologram may be illuminated using a color display mounted on the inlay below the position of the hologram. LEDs for illuminating the hologram are represented in FIG. 5 by elements 534 extending from the chip 508 through the mold mass 532, behind the hologram.

The display can be used to signal to the bearer of the contactless bank card that a financial transaction had or will take place. The display can have matrices of red, green and blue pixels close together. To control the pixels, and to form the image required, either "passive" or "active" matrix driver methods can be used.

The display may be triggered through inductive coupling with the RFID reader as well as from the transponder. Polymer light emitting diodes (PLED) are especially suitable for incorporating into active matrix displays (TFT), as they can be manufactured using ink jet printing on the inlay substrate material. This does not however preclude the use of organic light emitting diodes for the display technology.

Flexible Displays

In ISO compliant card applications including One Time Password (OTP) generation, delivering two-factor authentication, electrochromic displays can be integrated into display cards using the conventional cold lamination process.

In another embodiment of the invention, a flexible display can be integrated into the card body, hot or warm laminated between several layers of substrate.

In the case of an active card incorporating a flexible electrochromic or electrophoretic display, with battery and switching elements, the technique of using a de-tuned primary antenna connected to an RFID chip and a switchable secondary antenna to bring the inductive coupling into resonance at the operating frequency of the RFID chip also applies with respect to anti-skimming measures. However, the process of manufacturing an active card differs significantly from that of a passive card. The multi-layers of a passive card are typically hot laminated together without additional compounds, whereby an active card is cold laminated. To prevent damage to the display and electronic circuitry, a binding material is used to build up the construction of the card body (refer to U.S. Pat. No. 5,399,847 & U.S. Pat. No. 5,741,392).

In the current invention, it is proposed to use extruded hot melt adhesive based on polyurethane in the form of a sheath substrate having a thickness of approximately 50 microns. Windows may be punched out of the polyurethane sheath to accommodate the display, electronic circuitry and switching elements. The card is then built up of synthetic material with a polyurethane sheath between each layer. The card is then hot laminated, reactivating the polyurethane adhesive, and creating a tamper proof active card which cannot be delaminated with heat.

The invention has been illustrated and described in a manner that should be considered as exemplary rather than restrictive in character—it being understood that only preferred embodiments have been shown and described, and that all changes and modifications that come within the spirit of the invention are desired to be protected. Undoubtedly, many other "variations" on the techniques set forth hereinabove will occur to one having ordinary skill in the art to which the present invention most nearly pertains, and such variations are intended to be within the scope of the invention, as disclosed herein.

What is claimed is:

1. Smart card comprising:
a multi-layer substrate;
a transponder module comprising an RFID chip disposed in a first layer of the multi-layer substrate;
a first antenna disposed in the first layer of the multi-layer substrate and connected to the transponder module; and
a second antenna which is a coupling antenna disposed in a second layer of the multi-layer substrate which is underlying the first layer so that the second antenna is inductively coupled with the first antenna;
wherein the first and second antennas are not connected with one another, but rather are inductively coupled with one another; and
wherein the first antenna is tuned to a first frequency which is relatively far from a desired operating frequency for the RFID chip, and the second antenna is tuned to a frequency which is relatively close to the desired operating frequency.

2. The smart card of claim 1, further comprising:
a switch disposed in the second layer of the multi-layer substrate, for selectively connecting or disconnecting ends of the second antenna.

3. The smart card of claim 2, further comprising:
a capacitor disposed in the second layer of the multi-layer substrate, in series with an end of the second antenna.

4. The smart card of claim 2, wherein:
the switch is selected from the group consisting of a toggle switch, a slide switch, a QTC switch, a piezo film switch and a touch sensor switch.

5. The smart card of claim 1, wherein:
the first antenna is tuned to approximately 50 MHz, and the second antenna is tuned to approximately 14.5 MHz; and
the desired operating frequency is approximately 13.56 MHz.

6. The smart card of claim 1, wherein:
the first antenna comprises 1 turn of wire, and the second antenna comprises several turns of wire.

7. The smart card of claim 1, wherein:
the first antenna has a relatively low Q factor, and the second antenna has a relatively high Q factor.

8. The smart card of claim 1, wherein:
the first antenna has a relatively low inductivity, and the second antenna has a relatively high inductivity.

9. The smart card of claim 1, wherein:
the RFID chip is disposed in a recess in the first layer of the substrate.

10. The smart card of claim 1, wherein:
the RFID chip is disposed on a carrier.

11. The smart card of claim 1, wherein:
the first antenna is incorporated on the RFID chip.

12. The smart card of claim 1, wherein:
the chip is disposed in a mold mass.

13. The smart card of claim 1, further comprising:
a hologram disposed on the first layer of the substrate.

14. The smart card of claim 13, further comprising:
a layer of ferrite material disposed between the hologram and the RFID chip.

15. The smart card of claim 13, further comprising:
LEDs disposed behind the hologram.

16. The smart card of claim 1, further comprising:
a switch for switching the second antenna on and off, to control unauthorized access to the smart card;
wherein the switch is disposed under the RFID chip.

* * * * *